(12) United States Patent
Warren et al.

(10) Patent No.: US 8,552,540 B2
(45) Date of Patent: Oct. 8, 2013

(54) WAFER LEVEL PACKAGE WITH THERMAL PAD FOR HIGHER POWER DISSIPATION

(75) Inventors: Robert W. Warren, Newport Beach, CA (US); Nic Rossi, Causeway Bay (HK)

(73) Assignee: Conexant Systems, Inc., Irvine, CA (US)

( * ) Notice: Subject to any disclaimer, the term of this patent is extended or adjusted under 35 U.S.C. 154(b) by 0 days.

(21) Appl. No.: 13/104,620

(22) Filed: May 10, 2011

(65) Prior Publication Data

US 2012/0286408 A1    Nov. 15, 2012

(51) Int. Cl.
*H01L 23/495* (2006.01)

(52) U.S. Cl.
USPC ......... 257/673; 257/E23.06; 257/E21.499; 257/684; 257/685; 257/686; 438/122

(58) Field of Classification Search
USPC .......... 257/621, E23.08, E21.499, 684–686, 257/692, 700, 774, E23.06, E23.001, 257/E23.142, E23.145, E23.169, E21.505
See application file for complete search history.

(56) References Cited

U.S. PATENT DOCUMENTS

| | | | | |
|---|---|---|---|---|
| 5,497,033 A * | 3/1996 | Fillion et al. | ............ | 257/723 |
| 5,616,957 A | 4/1997 | Kajihara | | |
| 5,656,864 A | 8/1997 | Mitsue et al. | | |
| 5,672,548 A | 9/1997 | Culnane et al. | | |
| 5,886,408 A | 3/1999 | Ohki et al. | | |
| 6,097,602 A | 8/2000 | Witchger | | |
| 6,239,482 B1 * | 5/2001 | Fillion et al. | ............ | 257/678 |
| 6,506,632 B1 * | 1/2003 | Cheng et al. | ............ | 438/126 |
| 6,507,116 B1 | 1/2003 | Caletka et al. | | |
| 6,548,338 B2 * | 4/2003 | Bernstein et al. | ............ | 438/210 |
| 6,734,552 B2 | 5/2004 | Combs et al. | | |
| 6,891,259 B2 | 5/2005 | Im et al. | | |
| 6,962,867 B2 * | 11/2005 | Jackson et al. | ............ | 438/622 |
| 7,061,113 B2 * | 6/2006 | Fujiwara et al. | ............ | 257/758 |
| 7,064,440 B2 * | 6/2006 | Jobetto et al. | ............ | 257/758 |
| 7,112,469 B2 * | 9/2006 | Mihara | ............ | 438/110 |
| 7,126,218 B1 | 10/2006 | Darveaux | | |

(Continued)

FOREIGN PATENT DOCUMENTS

| | | |
|---|---|---|
| EP | 0987757 | 3/2000 |
| WO | 02061830 | 8/2002 |

OTHER PUBLICATIONS

European Patent Office; International Search Report; PCT Application No. PCT/US2009/038592; Oct. 29, 2009.

(Continued)

*Primary Examiner* — N Drew Richards
*Assistant Examiner* — Ankush Singal
(74) *Attorney, Agent, or Firm* — Jackson Walker L.L.P.; Christopher J. Rourk

(57) ABSTRACT

Wafer level packaging (WLP) packages semiconductor dies onto a wafer structure. After the wafer level package is complete, individual packages are obtained by singulating the wafer level package. The resulting package has a small form factor suitable for miniaturization. Unfortunately conventional WLP have poor heat dissipation. An interposer with a thermal pad can be attached to the semiconductor die to facilitate improved heat dissipation. In one embodiment, the interposer can also provide a wafer substrate for the wafer level package. Furthermore, the interposer can be constructed using well established and inexpensive processes. The thermal pad attached to the interposer can be coupled to the ground plane of a system where heat drawn from the semiconductor die can be dissipated.

6 Claims, 31 Drawing Sheets

(56) References Cited

U.S. PATENT DOCUMENTS

| | | | |
|---|---|---|---|
| 7,193,301 B2 * | 3/2007 | Yamaguchi | 257/678 |
| 7,202,561 B2 | 4/2007 | Seo | |
| 7,279,750 B2 * | 10/2007 | Jobetto | 257/347 |
| 7,295,441 B1 * | 11/2007 | Laio et al. | 361/719 |
| 7,494,843 B1 * | 2/2009 | Lin et al. | 438/106 |
| 7,669,320 B2 * | 3/2010 | Hurwitz et al. | 29/846 |
| 7,700,986 B2 * | 4/2010 | Huang et al. | 257/301 |
| 7,830,000 B2 * | 11/2010 | Eichelberger et al. | 257/706 |
| 7,911,044 B2 * | 3/2011 | Yang et al. | 257/685 |
| 7,915,728 B2 * | 3/2011 | Chiang et al. | 257/706 |
| 7,964,959 B2 * | 6/2011 | Jung | 257/713 |
| 7,981,722 B2 * | 7/2011 | Yamagata | 438/106 |
| 8,013,440 B2 | 9/2011 | Warren | |
| 8,186,046 B2 * | 5/2012 | Tanaka | 29/832 |
| 8,188,378 B2 * | 5/2012 | Sakamoto et al. | 174/262 |
| 2002/0074649 A1 | 6/2002 | Chrysler et al. | |
| 2005/0062147 A1 * | 3/2005 | Wakisaka et al. | 257/712 |
| 2005/0095875 A1 * | 5/2005 | Huang et al. | 438/800 |
| 2006/0012017 A1 * | 1/2006 | Fujisawa et al. | 257/678 |
| 2006/0087037 A1 * | 4/2006 | Hsu | 257/738 |
| 2006/0097381 A1 | 5/2006 | Akram | |
| 2006/0115931 A1 * | 6/2006 | Hsu | 438/121 |
| 2006/0163722 A1 * | 7/2006 | Hsu | 257/737 |
| 2007/0096313 A1 * | 5/2007 | Chou et al. | 257/737 |
| 2007/0145594 A1 * | 6/2007 | Park | 257/763 |
| 2007/0161231 A1 * | 7/2007 | Chun | 438/637 |
| 2007/0163645 A1 * | 7/2007 | Gonda et al. | 136/263 |
| 2007/0187836 A1 * | 8/2007 | Lyne | 257/777 |
| 2007/0289127 A1 * | 12/2007 | Hurwitz et al. | 29/827 |
| 2008/0020566 A1 * | 1/2008 | Egitto et al. | 438/637 |
| 2008/0054454 A1 * | 3/2008 | Kagawa et al. | 257/734 |
| 2008/0153245 A1 * | 6/2008 | Lin et al. | 438/381 |
| 2008/0157341 A1 * | 7/2008 | Yang et al. | 257/700 |
| 2009/0045487 A1 * | 2/2009 | Jung | 257/621 |
| 2009/0166841 A1 * | 7/2009 | Hsu et al. | 257/690 |
| 2009/0184420 A1 * | 7/2009 | Choi et al. | 257/738 |
| 2009/0200662 A1 * | 8/2009 | Ng et al. | 257/723 |
| 2009/0224402 A1 * | 9/2009 | Do et al. | 257/738 |
| 2009/0242252 A1 * | 10/2009 | Tanaka | 174/260 |
| 2010/0001309 A1 * | 1/2010 | Wang et al. | 257/99 |
| 2010/0078655 A1 * | 4/2010 | Yang | 257/81 |
| 2010/0246152 A1 * | 9/2010 | Lin et al. | 361/783 |
| 2010/0264526 A1 * | 10/2010 | Jimmy et al. | 257/668 |
| 2010/0290191 A1 * | 11/2010 | Lin et al. | 361/704 |
| 2011/0084401 A1 * | 4/2011 | Lee et al. | 257/774 |
| 2011/0256714 A1 * | 10/2011 | Yang | 438/652 |
| 2011/0278722 A1 * | 11/2011 | Miki | 257/737 |
| 2012/0061825 A1 * | 3/2012 | Chang et al. | 257/737 |

OTHER PUBLICATIONS

European Patent Office; Written Opinion; PCT Application No. PCT/US2009/038592; Oct. 29, 2009.

European Patent Office; International Preliminary Report on Patentability; PCT Application No. PCT/US2009/038592; Sep. 28, 2010.

* cited by examiner

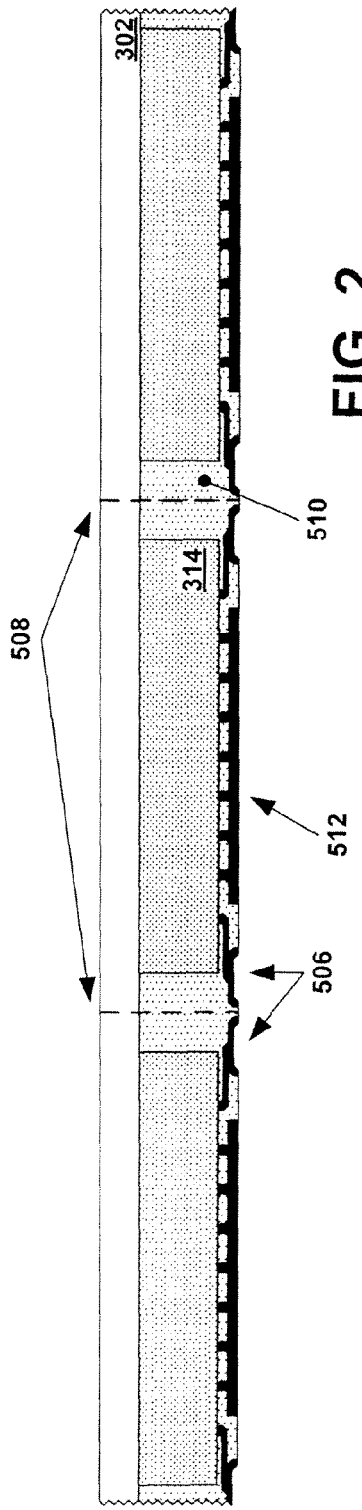
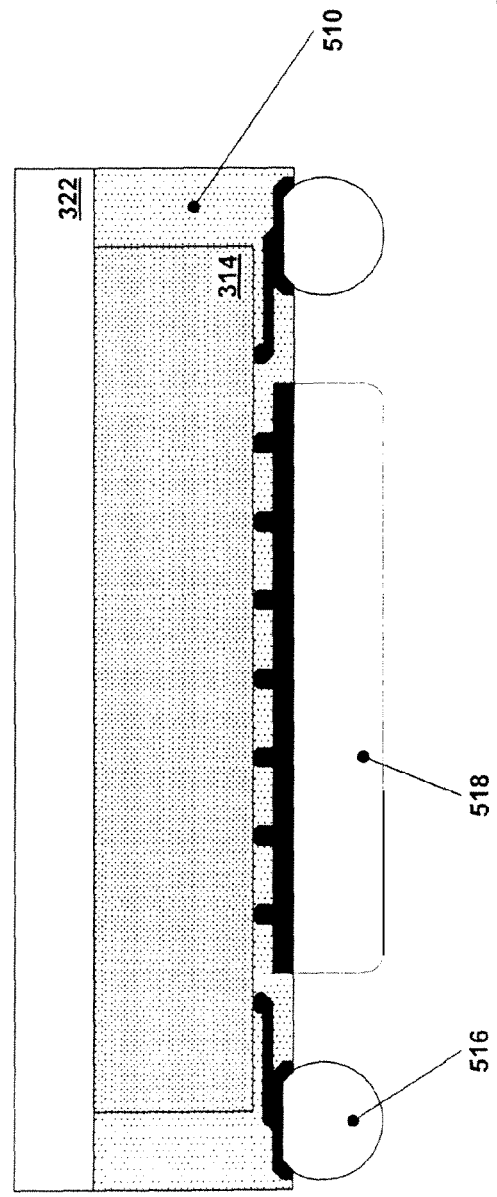

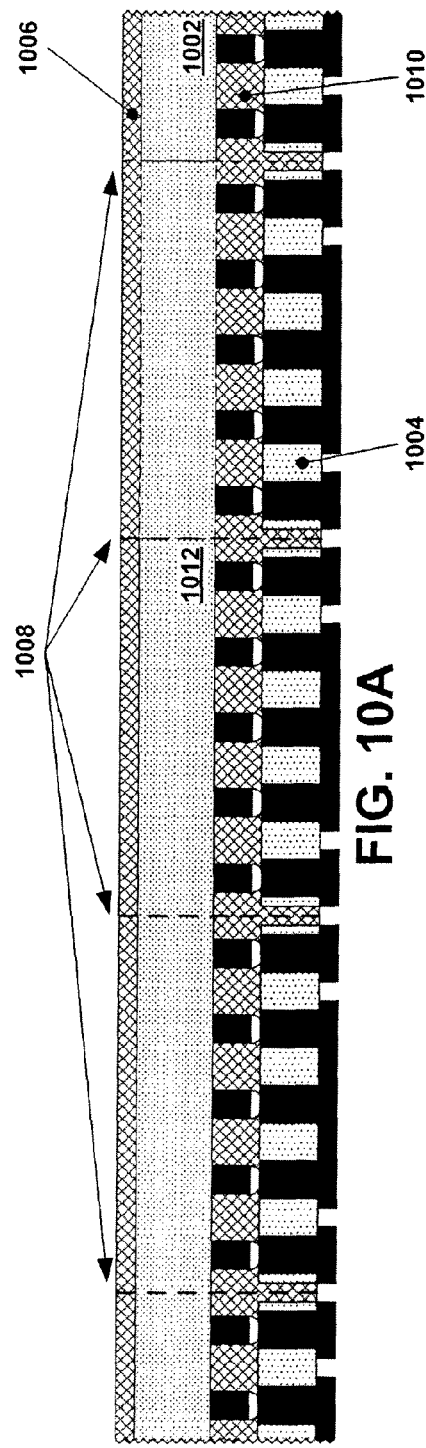
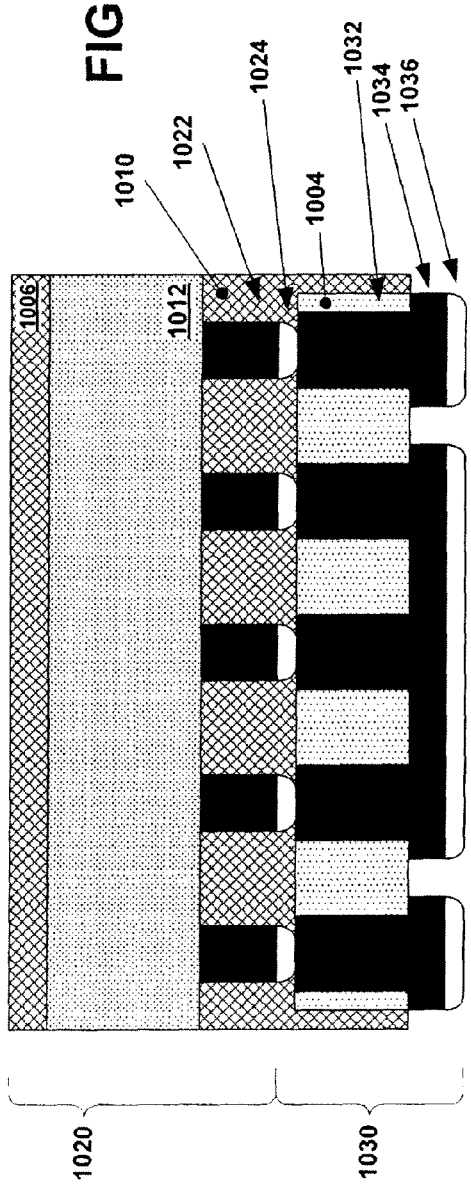

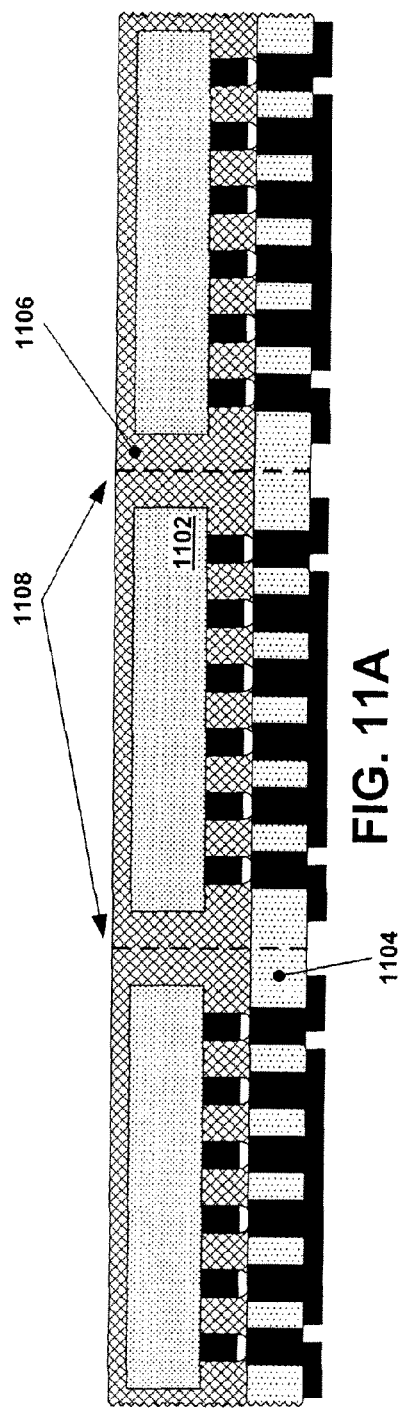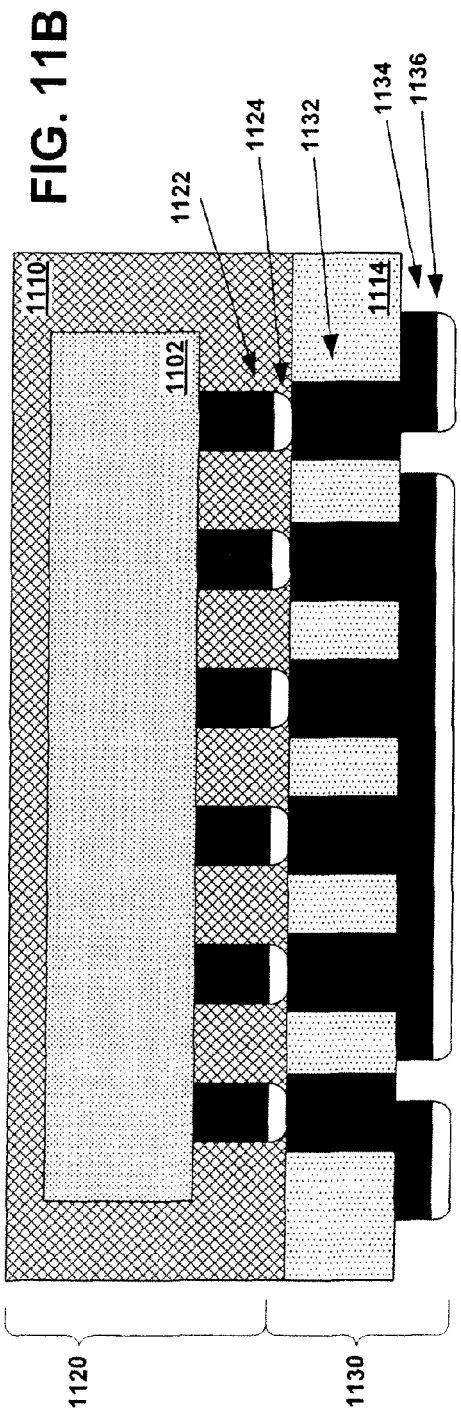

WAFER LEVEL PACKAGE WITH THERMAL PAD FOR HIGHER POWER DISSIPATION

TECHNICAL FIELD

The present disclosure relates generally to semiconductor packaging and more specifically to wafer level packaging (WLP).

BACKGROUND OF THE INVENTION

WLP refers to semiconductor packages that are formed at the wafer level prior singulation and then singulated into their individual dies. As a result WLP packages can have a small foot print size—often as small as the fabricated die itself. WLP can be formed on the same wafer as an active die or active dies can be attached to a wafer substrate.

WLP can streamline the semiconductor manufacturing process by fully integrating wafer fabrication, packaging and even testing.

In order to accommodate the miniaturization resultant from WLP, smaller solder balls are used. Often the solder balls used to interface a package to a printed circuit board (PCB) in assembly are relied upon to offer thermal dissipation. However, WLP packages suffer from diminished thermal dissipation due to the reduction in size and pitch of the solder balls.

SUMMARY OF THE INVENTION

WLP packages can be formed with added heat dissipation capabilities by providing thermal pads on an interposer and attaching the interposer onto an active semiconductor die. Each semiconductor die is transformed into a bumped device (i.e., a semiconductor die with pillars or bumps formed onto the active surface) by forming metal pillars onto the active surface of the die. Some metal pillars are used for electrical conductivity and are coupled to the bond pads on the die, while others can be used for thermal conduction. The bumped devices are bonded to the interposers by heating metal bumps on the metal pillars. In one embodiment, the active dies on a wafer are attached to interposers that have been singulated. In another embodiment, the active dies are singulated and are attached to interposers built onto a single wafer. In still another embodiment, both the active dies and the interposer substrates are wafers during the packaging process. The interposers comprise through vias which couple the metal pillars to an interface pad on the opposite surface of the interposer. The interposer can comprise a large thermal pad which can later be coupled to a ground plane of a system for better thermal dissipation. In another embodiment, the interposer can also comprise a redistribution layer which has metal traces connecting the through vias with the interface pads.

In one embodiment, the metal pillars can comprise copper. In another embodiment, the metal bumps can comprise, solder, tin gold, silver or any combination thereof. In another embodiment, the through vias, interface pads, and/or metal traces can comprise copper, tungsten, gold or any combination thereof. In still another embodiment, the interface pads are plated with solder, tin, nickel, palladium, gold or any combination thereof. For example, the interface pads can be plated first with nickel, then with palladium. In another example, the interface pads can be plated with nickel, then palladium and flash plated with gold. In yet another embodiment, the interposer is formed on a silicon substrate.

The process of packaging of the active die comprises several steps including attaching metal pillars to the semiconductor, forming the metal bumps on each metal pillar, bonding the metal pillars to a corresponding through via on an interposer, encapsulating the entire structure in a mold compound; and singulating the structure into individual packages.

The interposer can be fabricated by forming a plurality deep holes into which vias are to be formed, depositing a barrier layers onto the walls of the holes and on the interface surface of the substrate, depositing and patterning metal on the interface surface of the substrate.

In another embodiment, the interposer is a metal leadframe rather than fashioned on a wafer. The packaging process steps are similar to that of an interposer formed on a wafer, but may include an additional step of etching or removing excess metal from the leadframe to give definition to the leadframe features such as the thermal pad, electrical pads and metal traces.

In an alternate embodiment, a thermal pad is formed under an active die in a fan-out configuration without the use of an interposer. The package is formed by applying a passivation layer on the active surface of the die, creating openings in the passivation layer to accommodate vias to connect a redistribution layer and a thermal pad to the active die. Metal is deposited into the openings. Additional passivation material is deposited in another layer and further openings are made to complete the thermal and electrical interface pads.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views, and in which:

FIGS. 2, 3 and 4 show an example of a fan-out WLP with a thermal pad and pillars as a standoff;

FIGS. 10A and 10B illustrate another embodiment of an WLP package with an interposer, in accordance with an exemplary embodiment of the present disclosure;

FIGS. 11A and 11B illustrate an embodiment of a fan-out WLP package with an interposer, in accordance with an exemplary embodiment of the present disclosure;

The process of assembling the WLP package comprises an additional step over that described in FIG. 21 and is described in FIG. 28.

DETAILED DESCRIPTION OF THE PREFERRED EMBODIMENTS

A detailed description of embodiments of the present disclosure is presented below. While the disclosure will be described in connection with these drawings, there is no intent to limit it to the embodiment or embodiments disclosed herein. On the contrary, the intent is to cover all alternatives, modifications and equivalents included within the spirit and scope of the disclosure as defined by the appended claims.

Figure 1A:
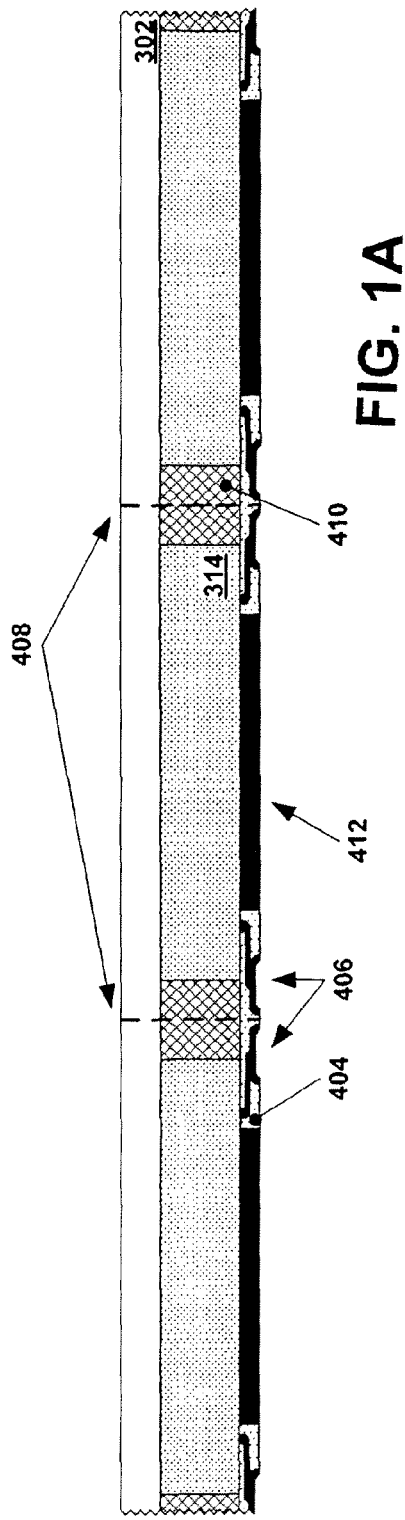
FIGS. 1A and 1B show an example of a fan-out WLP with a thermal pad to improve thermal dissipation.
Figure 1B:
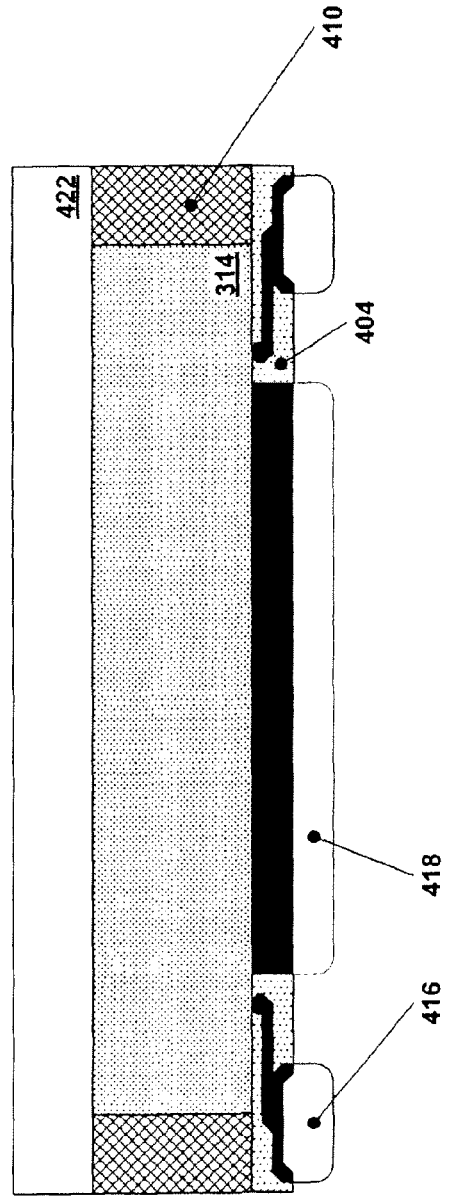

FIGS. 1A and 1B show an example of a fan-out WLP with a thermal pad to improve thermal dissipation. Referring to FIG. 1A, the backside of a plurality of singulated dies (e.g., die 314) are attached to wafer 302. Gaps between the dies are filled by mold compound 410 such as a molded resin. The active surface of the die is covered with passivation layer 404. Formed within passivation layer 404 is a redistribution layer (representative indicated by arrows 406). The WLP package shown in FIG. 1A also comprises a thermal pad such as thermal pad 412 underneath each active die. The redistribution layer and the thermal pad comprise metal traces (such as copper). The redistribution layer couples bond pads on each singulated die to an interface pad towards the exterior of the package to allow for greater spacing and the inclusion of the thermal pad. FIG. 1B shows an individual singulated package. In addition to die 314, the package comprises wafer portion 422 which is the portion of wafer 302 attached to die 314 after singulation. Finally, to make the package ready for assembly, solder is attached to the interface pads including thermal pad 412. In this example, solder is built up either by plating or stenciling onto the electrical interface pads indicated by solder 416 and onto the thermal pad indicated by solder 418. The solder can be applied either before or after singulation.

In this particular example, thermal pad 412 is a solid piece of the chosen metal. This provides a great deal of thermal dissipation from the active die into a PCB. However, if the active die is sufficiently large, stresses due to the different thermal coefficients of expansion of the active die, the PCB and the thermal pad could damage the package during the packaging or assembly process when the temperature is drastically changed (e.g., heating in a reflow oven). In order to alleviate the stress in larger packages, pillars can be constructed between the thermal pad and the active die as a stand off.

Figure 4:
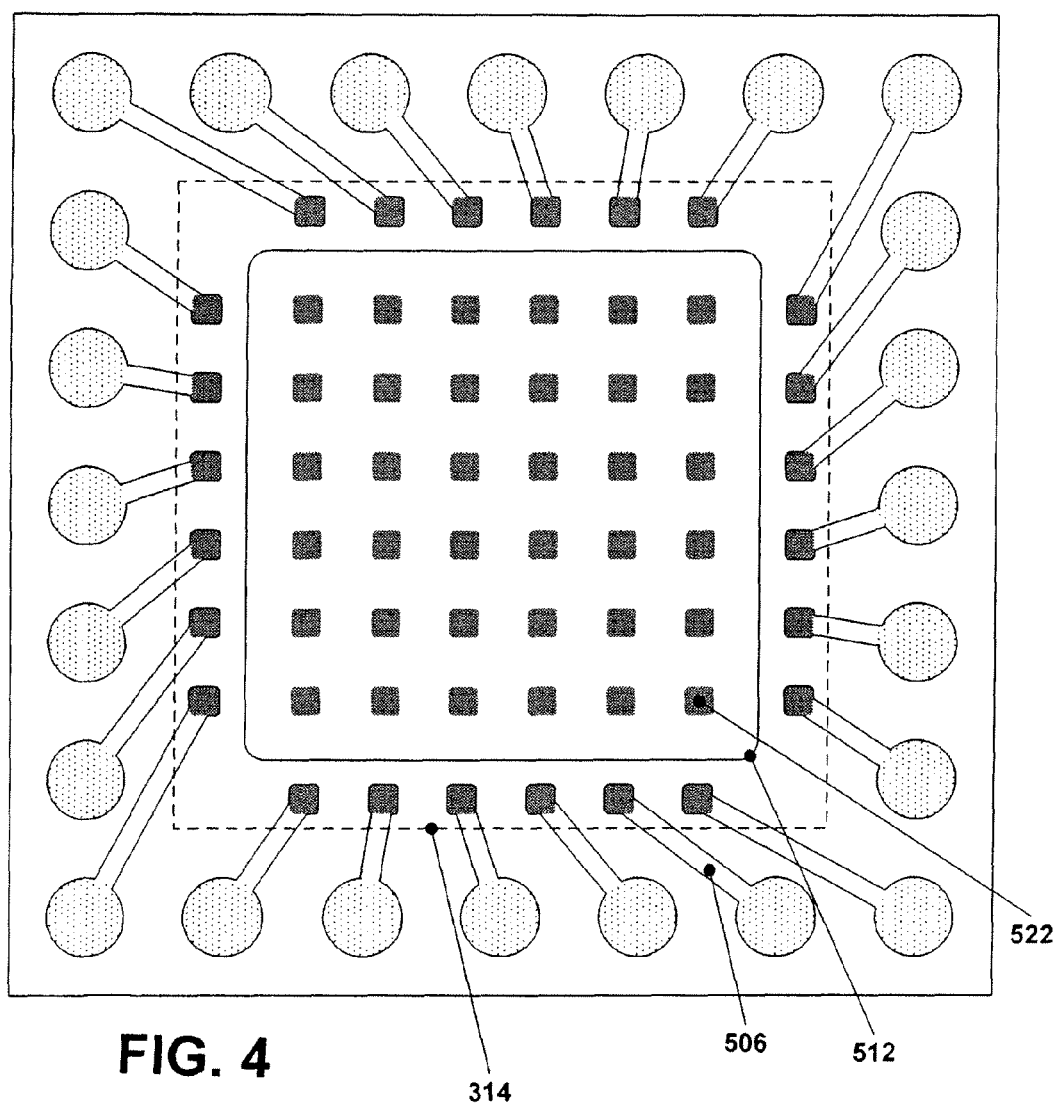

FIGS. 2, 3 and 4 show an example of a fan-out WLP with a thermal pad and pillars as a standoff. Referring to FIG. 2, the backside of a plurality of singulated dies (e.g., die 314) are attached to wafer 302. In this example, unlike the examples shown in FIG. 1, the gaps between the dies are filled with the same material as the passivation layer. Passivation material 510 fills both the gaps between the dies and provides a passivation layer which covers the active surface of each die. Formed within the passivation layer is a redistribution layer (representative indicated by arrows 506.) and thermal pads represented by thermal pad 512. Unlike thermal pad 412 in FIG. 1, thermal pad 512 is connected to active die 314 by an array of pillars. This allows the WLP package to flex during changes in temperature. The pillars can absorb the coefficient of thermal expansion stress that would otherwise be imparted to the device. FIG. 3 shows the corresponding singulated package. In addition to die 314 described above, the package comprises wafer portion 522 which is the portion of wafer 302 attached to die 314 after singulation. Finally, to make the package ready for assembly solder is attached to the interface pads including thermal pad 512. In this example, solder is built up either by plating or stenciling onto thermal pad 512 indicated by solder 518 to the same height as the solder balls. Then solder balls such as solder ball 516 are ball dropped onto their corresponding electrical pad. This process of applying solder can take place either before or after singulation. It should be noted that this approach could be used with a solid thermal pad such as thermal pad 412 in FIG. 2 or the approach described above of building up the solder on both the interface pads and thermal pads could be used in this example.

FIG. 4 shows an exemplary pattern of interface pads. In this example, the electrical interface pads such as one connected to connection structure 506 are connected to bond pads by use of metal traces within a redistribution layer. Thermal pad 512 is shown with pillars 522 used as a stand off. The dotted area indicates the footprint of active die 314.

Figure 5:
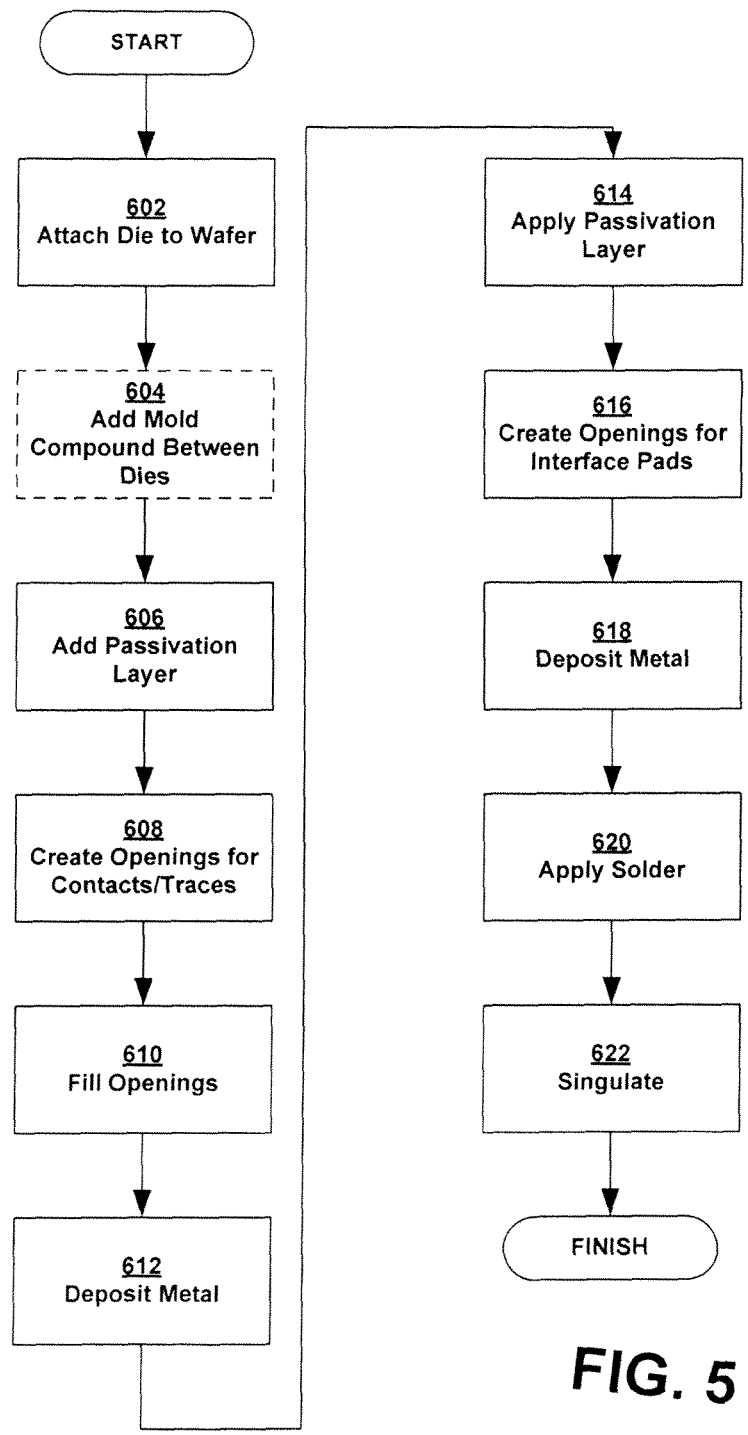
FIG. 5 describes a method of packaging an active die in a WLP package with a thermal pad in accordance with an exemplary embodiment of the present disclosure.

FIG. 5 describes a method of packaging an active die in a WLP package with a thermal pad in accordance with an exemplary embodiment of the present disclosure. FIGS. 6A-6E shows various exemplary thermal pad embodiments, FIG. 6F shows an exemplary alternate embodiment of an electrical pad, and FIGS. 7A-J show exemplary structures corresponding to the steps of the method of FIG. 5. Different configurations of the thermal pad structure can be fabricated, and several exemplary embodiments are shown in FIGS. 6A-6E. The examples depicted in FIGS. 7A-7J demonstrate a series of fabrication steps for the structure shown in FIG. 6B. At step 602, the backside of active dies including exemplary die 314 are attached to wafer 302 as shown in FIG. 7A. At step 604, optionally a mold compound can be deposited between active dies. However, if the mold compound used as passivation between active dies is also the same material used as the passivation layer in the redistribution layer, then step 604 can be combined with step 606. At step 606, passivation layer 510 is applied atop the active die. In FIG. 7B, the passivation layer and the fill between active dies are combined into one step resulting in passivation layer 510 as shown. The passivation layer is usually a dielectric such as a polyimide or benzocyclobutene (BCB). At step 608, openings are made in the passivation layer to accommodate the vias for the array of pillars. Exemplary openings are shown in FIG. 7C with arrows 702. In this example, the openings are made for the stand offs to the thermal pad. As an alternative, a large opening can be made for a solid thermal pad. The opening for the large thermal pad can be made to the passivation layer, the large thermal pad can be deposited prior to the application of the passivation layer, or other suitable processes can be used. At step 610, metal is deposited in the openings in passivation layer 510 as show in FIG. 7D. This process can use sputtering, chemical vapor deposition (CVD), plating, or a combination thereof. The metal need not fill the openings completely, but should contain sufficient metal to provide contact between the fabricated die and the metal traces in the redistribution layer. At step 612, metal traces for the redistribution layer are deposited. The metal for the electrical redistribution is shown by arrow 704 and for the thermal pad by arrows 706. The redistribution layer and thermal pad can be deposited by sputtering and/or plating or alternatively by printing the metal traces onto the passivation layer or by a combination thereof as shown in FIG. 7E. The metal traces for the bond pad can be a pillar over the pillars created by steps 608 and 610 (e.g., FIGS. 6B and 6E, respectively), a metal layer spanning the extent of the thermal pad (e.g., FIGS. 6A and 6C, respectively) or a general redistribution (e.g., FIG. 6D). At step 614, another layer of passivation material is deposited as shown in FIG. 7F. At step 616, openings are created for the both the electrical and thermal bond pads as shown in FIG. 7G. Openings for the electrical pads are indicated by arrows 708 and for the thermal pad by arrows 710. In an alternate embodiment (e.g., FIGS. 6E and 6F) openings for vias to the electrical pads and thermal pad are created. At step 618, metal is deposited into the openings as shown in FIG. 7H. Examples of metal for the electrical pads are indicated by arrows 712. Examples of metal for the thermal pads are indicated by arrow 714. Once again this can be a sputtering, CVD or plating process or a combination thereof. In the alternate embodiment described above, the vias are filled at step 618 and additionally metal is deposited on the surface of the passivation layer to form interface pads. At step 620, solder is applied to the interface pads—solder 716 is applied to the electrical interface pads and solder 718 is applied to the thermal pad as shown in FIG. 7I. As described above, the solder can be stenciled or plated on. Alternatively, solder 718 could be stenciled or plated on to a predetermined height and solder 718 can be solder balls that are ball dropped onto their corresponding interface pads. At step 622, the package is singulated as shown in FIG. 7J.

Figure 6A:
FIGS. 6A-6E shows various exemplary thermal pad embodiments.
Figure 6B:
Figure 6C:
Figure 6D:
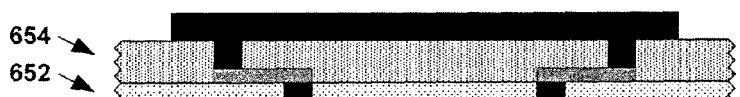
Figure 6E:
Figure 6F:
FIG. 6F shows an exemplary alternate embodiment of an electrical pad.
Figure 7A:
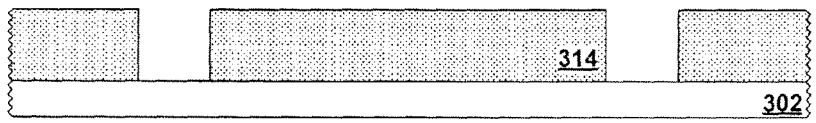
FIGS. 7A-J show exemplary structures corresponding to the steps of the method of FIG. 5.
Figure 7B:
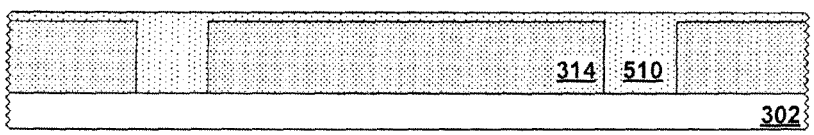
Figure 7C:
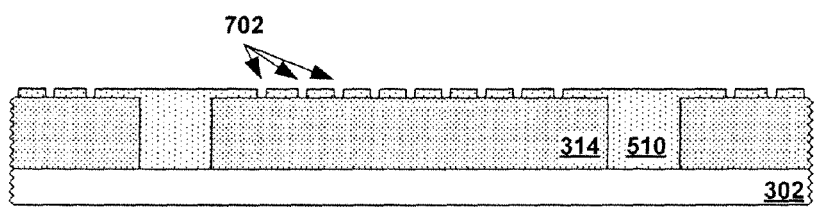
Figure 7D:
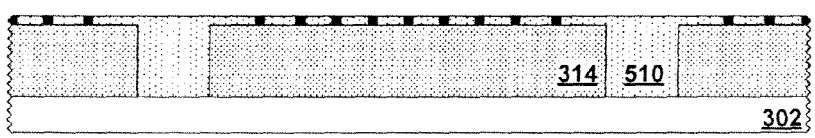
Figure 7E:
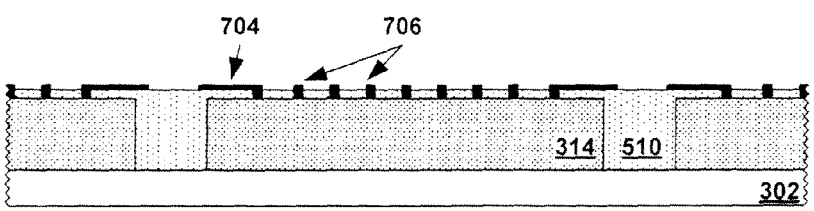
Figure 7F:
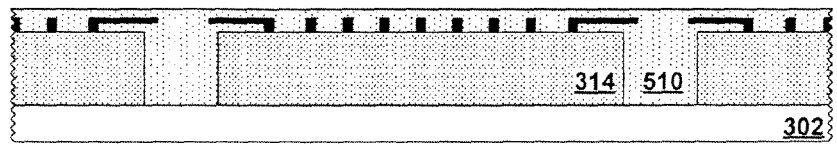
Figure 7G:
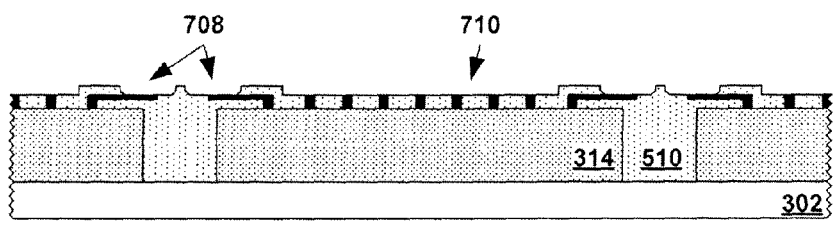
Figure 7H:
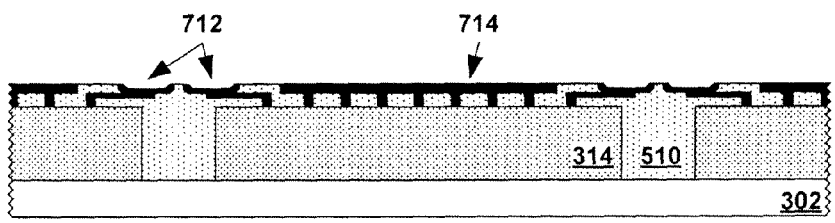
Figure 7I:
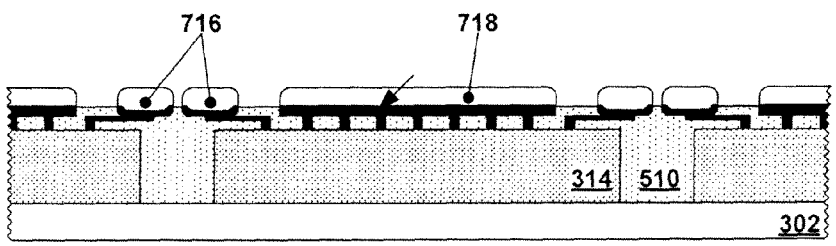
Figure 7J:
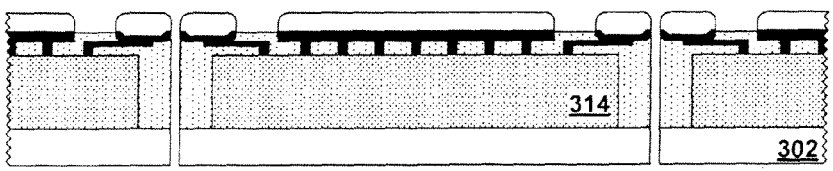

More specifically relating to FIGS. 6A-6F, each example shows the two passivation layers (denoted by arrows 652 and 654). The metal corresponding to the redistribution layer is shown in a lighter shade for clarity. In FIG. 6A, a solid thermal pad is shown. The thermal pad can be built up prior to applying the passivation layers or can be deposited according to the various steps described in FIG. 5. In FIG. 6B, the thermal pad is built on pillars coupled to the active die. A pillar (or alternatively) redistribution traces in a redistribution layer is formed on top of the first passivation layer. In FIG. 6C, the thermal pad is also built on pillars coupled to the active die. A metal layer serving as the base of the thermal pad is fashion during step 610 on top of the first passivation layer. In FIG. 6D, the thermal pad is once again built on pillars coupled to the active die. Redistribution traces in a redistribution layer is formed on top of the first passivation layer. However unlike FIG. 6B, vias are created in the second passivation layer to connect the redistribution traces to the thermal pad which is formed on top of the second passivation layer. FIG. 6E is similar to FIG. 6D except rather than redistribution traces, a pillar is formed on top of the passivation layer. Finally, FIG. 6F shows an electrical pad counterpart to FIG. 6E.

In FIG. 6B, the thermal pad is built on pillars coupled to the active die. A pillar (or alternatively) redistribution traces in a redistribution layer is formed on top of the first passivation layer.

An alternative method to improve thermal dissipation in WLP packages includes attaching the fabricated die to an interposer to the active side of the die. This also eliminates the need for a separate structural wafer (such as wafer 302) to be attached to the backside of the active dies as a foundation of the package. Several exemplary configurations are illustrated below. The interposer comprises through substrate vias for electrically and thermally coupling the active die to interface pads on the interposer. The inclusion of an interposer permits an inexpensive foundation upon which to form a relatively large thermal pad which itself permits greater thermal conductance of heat away from the active die.

Figure 8A:
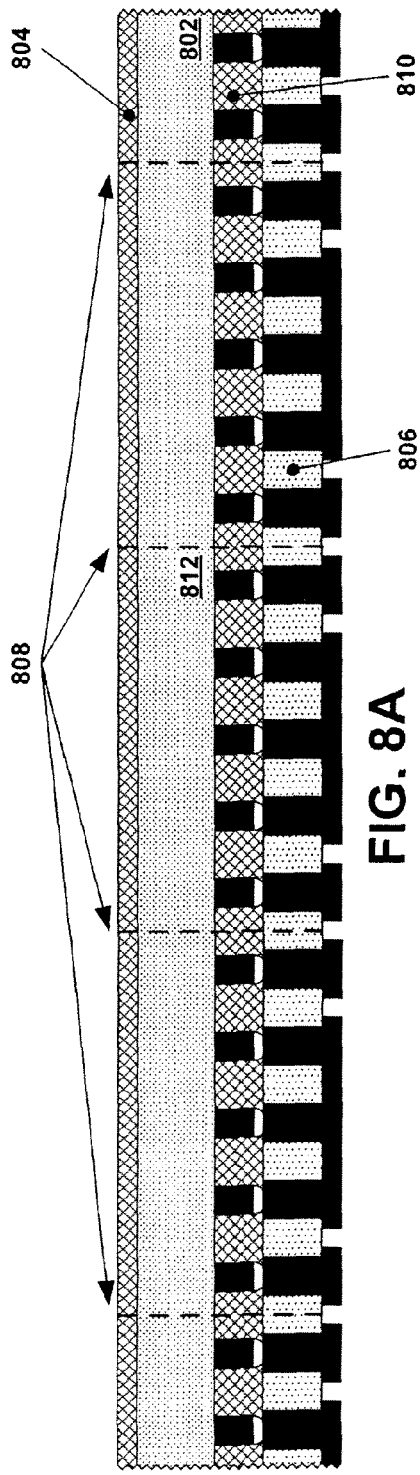
FIGS. 8A and 8B illustrate an embodiment of a WLP package with an interposer in accordance with an exemplary embodiment of the present disclosure.
Figure 8B:
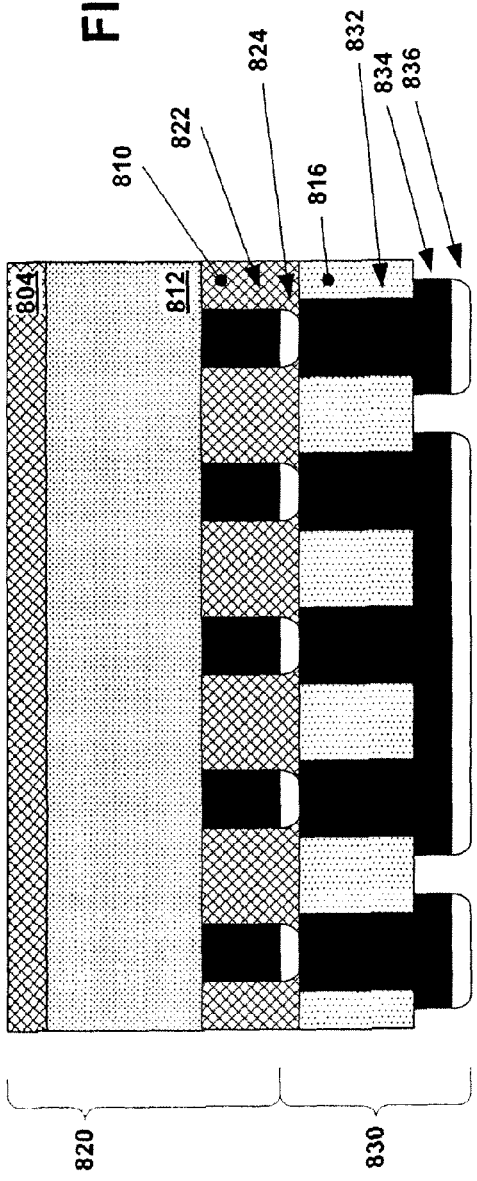

FIGS. 8A and 8B illustrate an embodiment of a WLP package with an interposer in accordance with an exemplary embodiment of the present disclosure. Interposer 830 is attached to bumped device 820. Bumped device 820 comprises active die 812 and metal pillars 822. Optionally, layer 804 is used to protect the backside of the active die. Bumps 824 couple metal pillars 822 to corresponding vias 832 on interposer 830. The exposed surface metal of each via can serve as a catch pad on interposer 830. The gap between bumped device 820 and interposer 830 is filled with moldable underfill 810. Interposer 830 comprises substrate 816 and vias 832, interface pads 834 and plating metal 836. Vias 832 are connected to interface pads 834. Each interface pad is plated with plating metal 836. In this embodiment, both the active die 812 and interposer substrate 816 are packaged as wafers prior to singulation. Referring to FIG. 8A, which shows the WLP package prior to singulation, active die 812 is part of wafer 802 which comprises a plurality of active dies. Interposer substrate 816 is part of substrate 806 which houses a plurality of interposers. After metal pillars are attached to the active dies on the wafers, the wafer of interposers is attached. After which, moldable underfill 810 is used to fill the gaps between the two wafers. Once the two wafers are packaged together, individual packages are singulated along dotted lines 808.

Figure 9A:
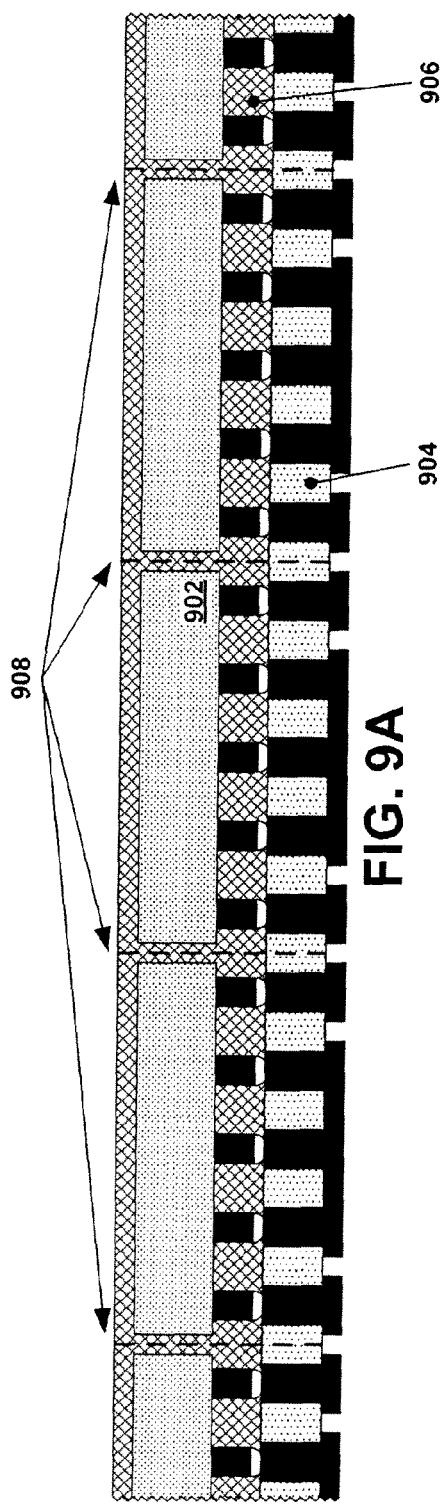
FIGS. 9A and 9B illustrate another embodiment of an WLP package with an interposer, in accordance with an exemplary embodiment of the present disclosure.
Figure 9B:
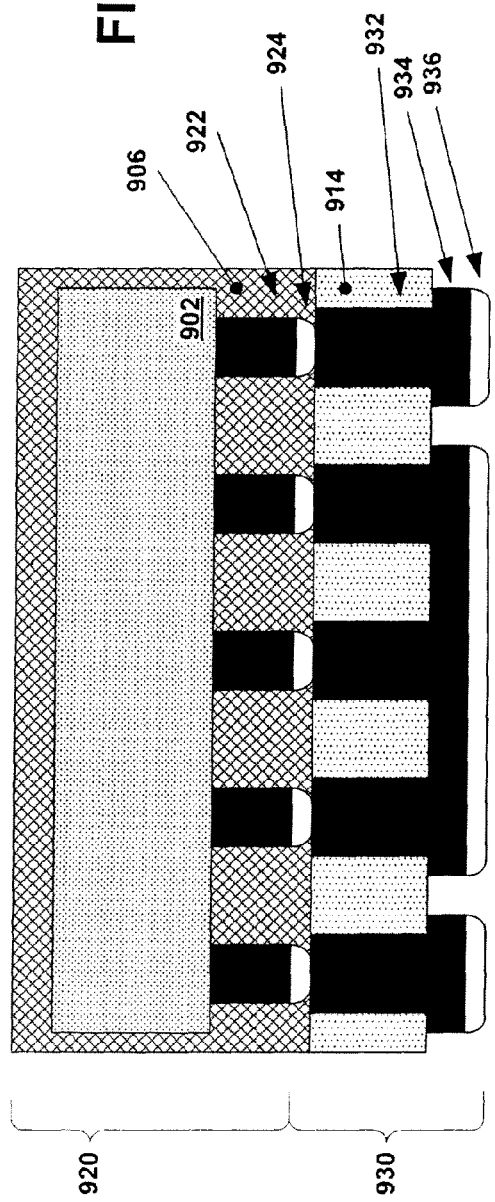

Another configuration attaches singulated dies to a wafer of interposers as given in the following example. FIGS. 9A and 9B illustrate another embodiment of a WLP package with an interposer, in accordance with an exemplary embodiment of the present disclosure. Interposer 930 is attached to bumped device 920. Similar to bumped device 820, bumped device 920 comprises active die 902 and metal pillars 922. Unlike bumped device 820, active die 902 is singulated prior to packaging and prior to being attached to interposer 930.

Interposer 930 comprises substrate 914, vias 932, interface pads 934 and plating metal 936. Vias 932 are connected to interface pads 934. Each interface pad is plated by metal 936. Bumps 924 on bumped device 920 couple metal pillars 922 to corresponding catch pads (e.g., surface metal of corresponding vias 932) on interposer 930. The gap between bumped device 920 and interposer 930 and the space around active die 902 is encapsulated with moldable underfill 906. Moldable underfill 906 can also be used to protect the backside of active die 902. In this embodiment, only the interposer substrate 914 is packaged as a wafer prior to singulation. Referring to FIG. 9A, which shows the WLP package prior to singulation, a plurality of active dies (represented by active die 902) are singulated prior to packaging. Interposer substrate 914 is part of substrate 904 which houses a plurality of interposers. After metal pillars are attached to the active dies, each active die is attached to a corresponding interposer on the wafer of interposers. After which, moldable underfill 906 is used to fill the gaps between the interposers and active dies as well as encapsulating the active dies. Once the packaging is completed, individual packages are singulated along dotted lines 908.

Yet another configuration attaches singulated interposers to a wafer of active dies as given in the following example. FIGS. 10A and 10B illustrate another embodiment of a WLP package with an interposer, in accordance with an exemplary embodiment of the present disclosure. Interposer 1030 is attached to bumped device 1020. Similar to bumped device 820, bumped device 1020 comprises active die 1012 and metal pillars 1022. Optionally, layer 1006 is used to protect the backside of the active die.

Interposer 1030 comprises substrate 1004, vias 1032, interface pads 1034 and plating metal 1036. Vias 1032 are connected to interface pads 1034. Each interface pad is plated by metal 1036. Bumps 1024 on bumped device 1020 couple metal pillars 1022 to corresponding catch pads (e.g., surface metal of corresponding vias 1032) on interposer 1030. The gap between bumped device 1020 and interposer 1030 and the space around interposer 1030 is encapsulated with underfill 1010. In this embodiment, only the active die 1012 is packaged as a wafer prior to singulation. Referring to FIG. 10A, which shows the WLP package prior to singulation, active die 1012 is part of wafer 1002 which comprises a plurality of active dies. However, each interposer is singulated prior to packaging. Each interposer is attached to a corresponding active die on wafer 1002. After which underfill 1010 is used to fill the gaps between the interposers and active dies as well as gaps between interposers. Once the packaging is completed, individual packages are singulated along dotted lines 1008.

FIGS. 8A, 8B, 9A, 9B, 10A and 10B show examples of fan-in WLP packaging using an interposer for improved heat dissipation. In these examples, the interface pads can be formed directly under the corresponding catch pads or can be fanned in from a catch pad towards the center as the thermal pad permits. As discussed later, the use of an interposer permits the creation of a thermal interface pad under the center of the active die which can be coupled during assembly to the ground plane of a printed circuit board (PCB) allowing for significant heat to be drawn away from the active dies and dissipated into the PCB. Further dissipation can improved by adopting the fan-out WLP style of interfacing, which can allow for greater spacing and/or additional I/O between electrical interface pads and a larger thermal interface pad.

FIGS. 11A and 11B illustrate an embodiment of a fan-out WLP package with an interposer, in accordance with an exemplary embodiment of the present disclosure. Interposer 1130 includes a redistribution layer to spread the interfacing across the interface surface of interposer 1130, and is attached to bumped device 1120. Bumped device includes active die 1102 and metal pillars 1122.

Interposer 1130 comprises substrate 1114, vias 1132, redistribution layer 1134 and plating metal 1136. Vias 1132 are connected to redistribution layer 1134. Redistribution layer comprises a plurality of interface pads and metal traces. The metal traces connect each interface pad to at least one via. Each interface pad is plated by metal 1136. Bumps 1124 on bumped device 1120 couple metal pillars 1122 to corresponding vias 1132 on interposer 1130. The gap between bumped device 1120 and interposer 1130 and the space around active die 1102 is encapsulated with underfill 1106. Underfill 1106 can also be used to protect the backside of active die 1102. In this embodiment, only the interposer substrate 1114 is packaged as a wafer prior to singulation. Referring to FIG. 11A, which shows the WLP package prior to singulation, a plurality of active dies (represented by active die 1102) are singulated prior to packaging. Interposer substrate 1114 is part of substrate 1104 which houses a plurality of interposers. Once the packaging is completed, individual packages are singulated along dotted lines 1108.

Referring to the WLP packages described in FIGS. 8A, 8B, 9A, 9B, 10A, 10B, 11A and 11B, the metal pillars, such as metal pillars 822, 922, 1022, or 1122, typically comprise copper. While other metals can be used, copper remains rigid during the reflow steps described below and during assembly. The bumps (which are also referred to as caps) such as bumps 824, 924, 1024 or 1124 typically comprise solder (e.g., tin), but can be made of a tin/silver alloy, gold, silver or copper. Generally, the bumps should comprise an electrically conductive material which will bond the metal pillars to the vias when suitably heated. The vias 832, 932, 1032, or 1132 comprise a metal such as copper, tungsten or gold. The interface pads such as interface pads 834, 934, 1034 or 1134 can also comprise a metal such as copper, tungsten or gold. The plate metal used in these packages such as metals 836, 936, 1036 or 1136 can comprise a solder material such as tin or a protective material such as a nickel/palladium alloy or nickel/palladium/gold. A protective material would prevent the underlying interface pads (and metal traces) from oxidizing to maintain the shelf life of the package where a solder material could be added at a later time. A solder material can be included in the package to facilitate bonding to a PCB. The interposer substrate can be selected from a number of materials such as silicon or a ceramic. However, a silicon substrate is a workable and an inexpensive choice of material. Finally, the mold compounds (such as indicated by 804, 810, 906, 1006, 1010, and 1106 can be any number of mold compounds commonly used for semiconductor encapsulation such epoxy-resins, hardeners, catalysts, or a combination thereof. These materials often comprise a fill material such as silica or a ceramic.

Figure 12:
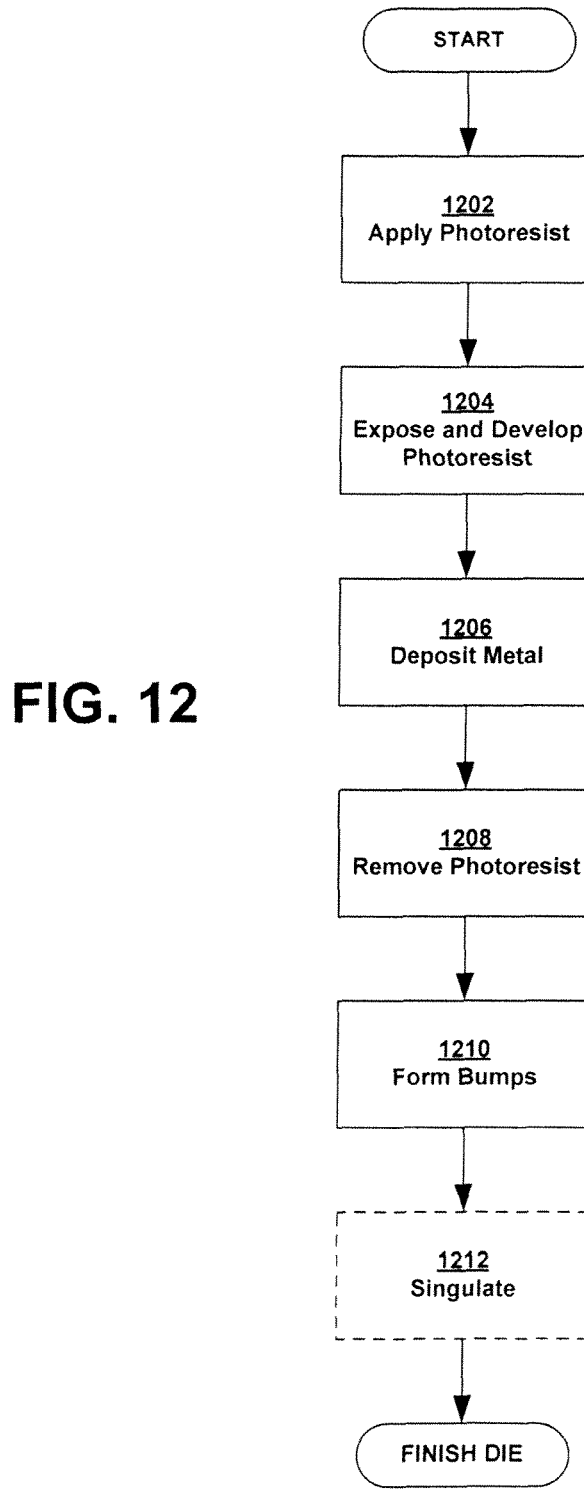
FIG. 12 is flow chart algorithm of an exemplary process for producing bumped devices from active dies.
Figure 13A:
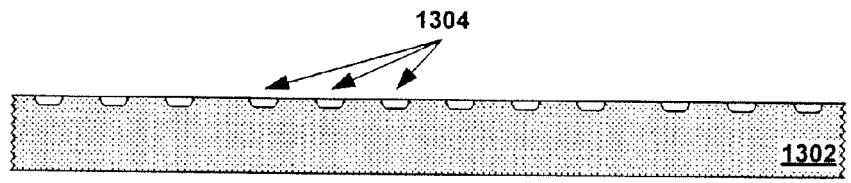
FIGS. 13A-13G are exemplary embodiments of the results of corresponding processing steps in accordance with an exemplary embodiment of the present disclosure.
Figure 13B:
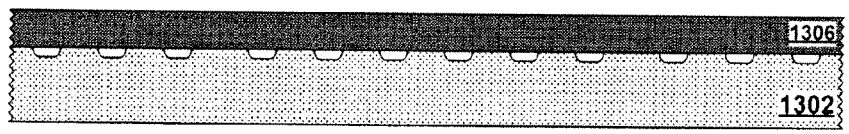
Figure 13C:
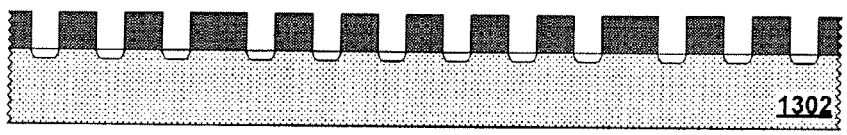
Figure 13D:
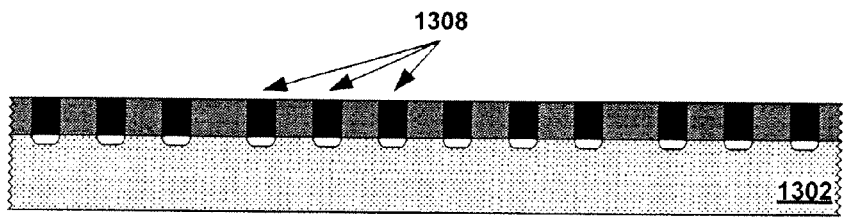
Figure 13E:
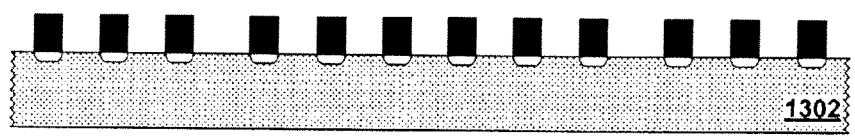
Figure 13F:
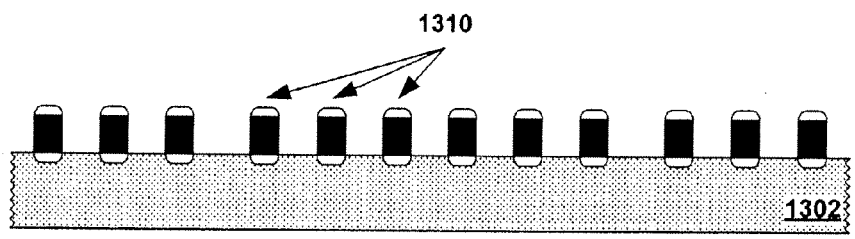
Figure 13G:
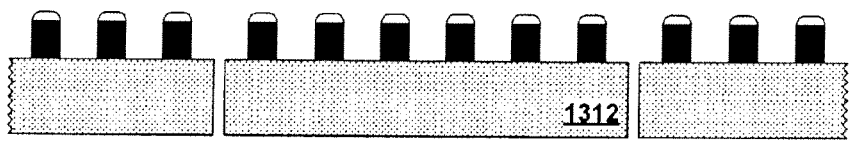

FIG. 12 is flow chart algorithm of an exemplary process for producing bumped devices from active dies, and FIGS. 13A-13G are exemplary embodiments of the results of corresponding processing steps in accordance with an exemplary embodiment of the present disclosure. FIG. 13A shows wafer 1302 comprising a plurality of active dies. Each active die comprises a plurality of bond pads represented by bond pads 1304. At step 1202, photoresist layer 1306 is applied to wafer 1302 as shown in FIG. 13B. At step 1204, photoresist layer 1306 is exposed to a mask and developed leaving openings above the bond pads as shown in FIG. 13C. At step 1206, metal 1308 is deposited into openings in photoresist layer 1306 as shown in FIG. 13D. The metal can be selected from a number of materials such as copper, aluminum and gold. The metal can be deposited by sputtering or by plating or a combination of both processes (e.g., a seed layer could be deposited by sputtering followed by a plating process to complete the deposition). At step 1208, photoresist layer 1306 is removed revealing metal pillars as shown in FIG. 13E. At step 1210, bumps represented by bumps 1310 are applied to the metal pillars as shown in FIG. 13F, for example by plating or stenciling. Finally, the active dies are optionally singulated at step 1212 and shown in FIG. 13G.

Figure 14:
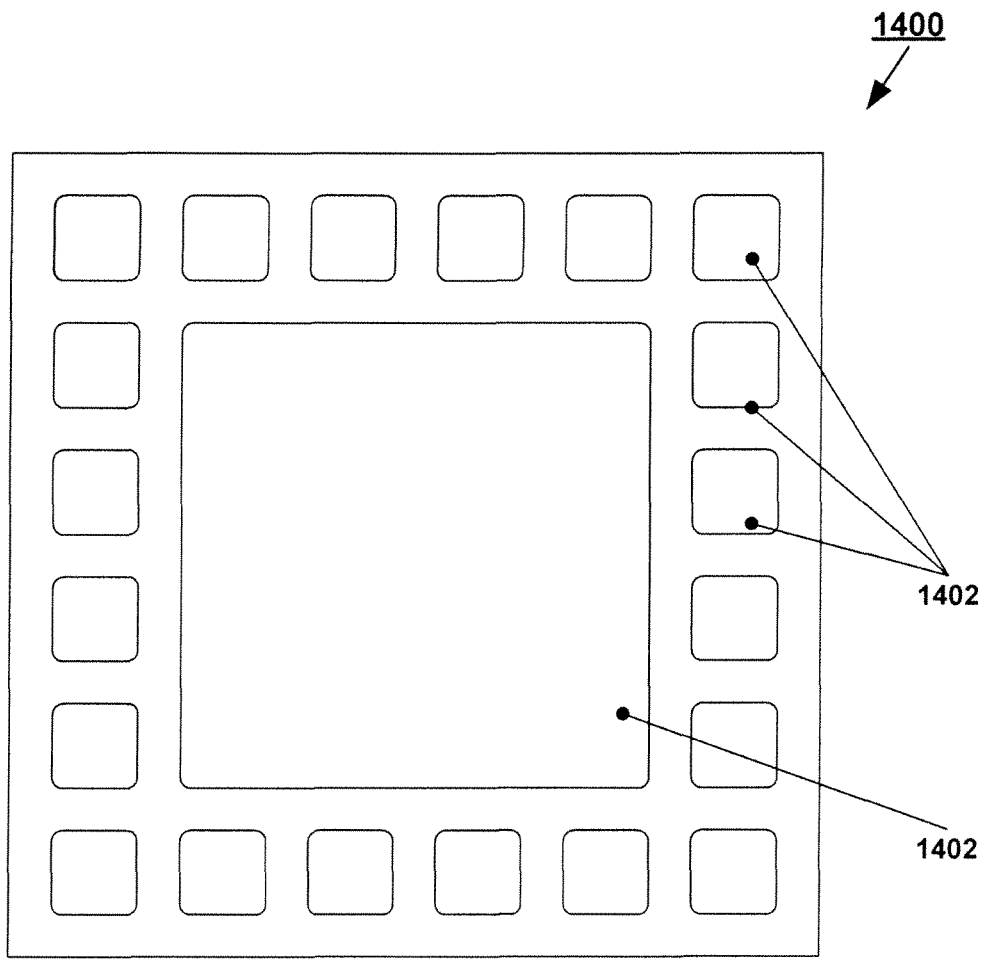
FIG. 14 is a top view of an active die fashioned with a thermal bond pad in accordance with an exemplary embodiment of the present disclosure.

The WLP packaging techniques described in this disclosure can be adapted to conventional semiconductor fabrication processes which leave bond pads exposed on the active surface of the die. Semiconductor fabrication processes can likewise be adapted to produce active dies, which can further exploit the heat dissipation advantages of the WLP packaging methods described herein. For example, in addition to electrical bond pads, a thermal bond pad could be patterned in the active surface of the active die. FIG. 14 is a top view of an active die fashioned with a thermal bond pad in accordance with an exemplary embodiment of the present disclosure. Active die 1400 comprises conventional bond pads represented by bond pads 1402 around the perimeter of the active die. It also comprises thermal pad 1404 in the center of the active die. Pillars can then be grown on these bond pads in the matter described in FIG. 12.

Figure 15:
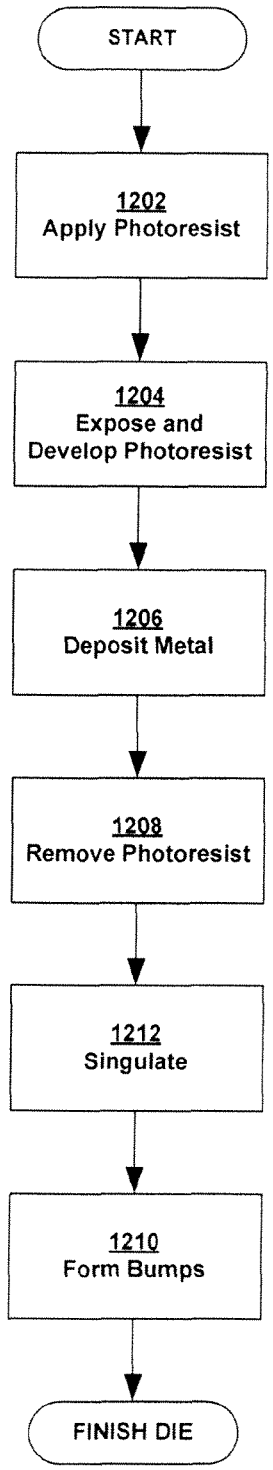
FIG. 15 and FIG. 16 are flow chart algorithms describing alternative ordering of steps in the production of bumped devices, in accordance with an exemplary embodiment of the present disclosure.
Figure 16:
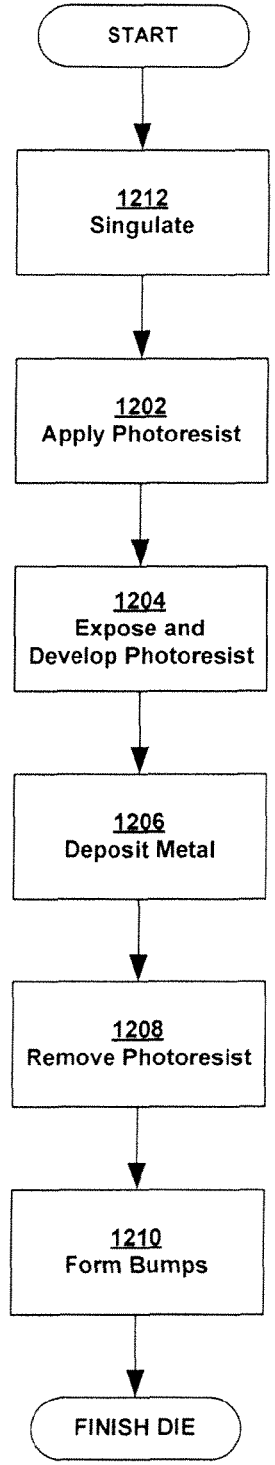

FIG. 15 and FIG. 16 are flow chart algorithms describing alternative ordering of steps in the production of bumped devices, in accordance with an exemplary embodiment of the present disclosure. In the process shown in FIG. 15, singulation takes place after the metal pillars are deposited but before bumps are applied to the metal pillars. In the process shown in FIG. 16, the metal pillars are grown on singulated active dies. The variation in order may be necessary to accommodate the individual capabilities of each particular packaging vendor.

Figure 17:
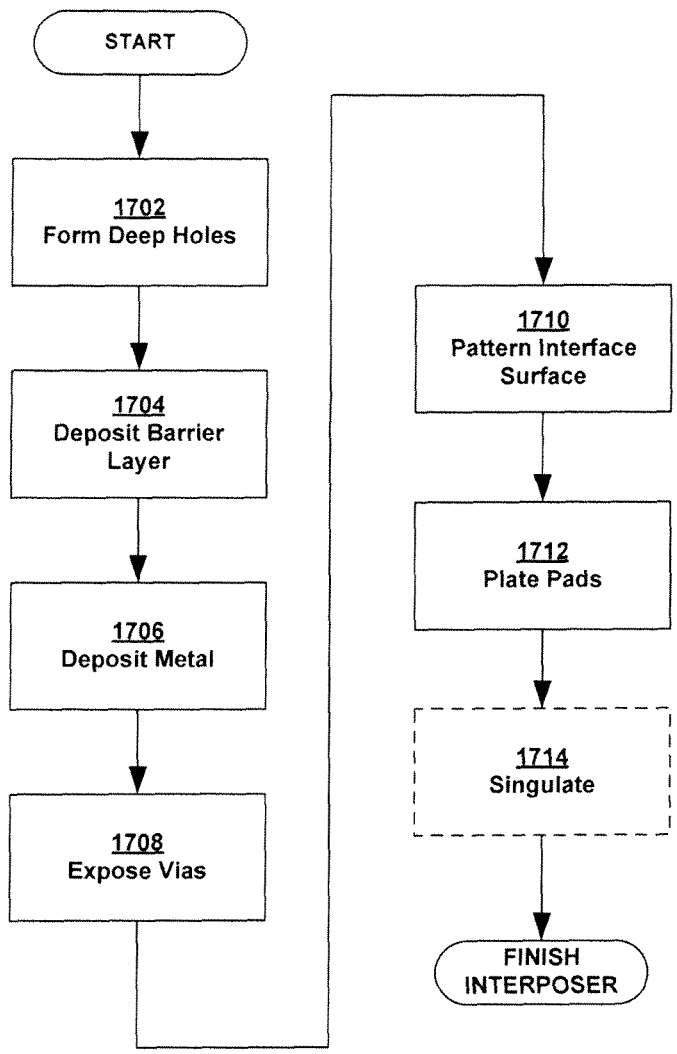
FIG. 17 is a flow chart algorithm for producing interposers in accordance with an exemplary embodiment of the present disclosure.
Figure 18A:
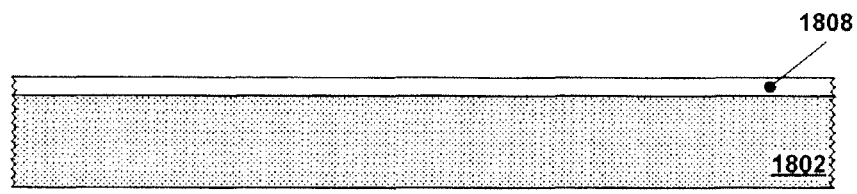
FIGS. 18A-18J show exemplary results of corresponding processing steps.
Figure 18B:
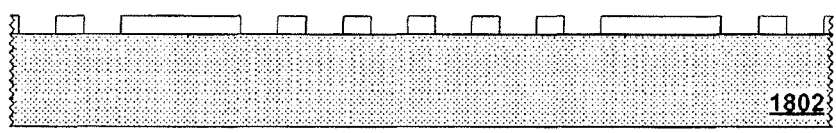
Figure 18C:
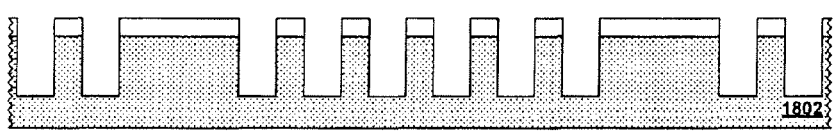
Figure 18D:
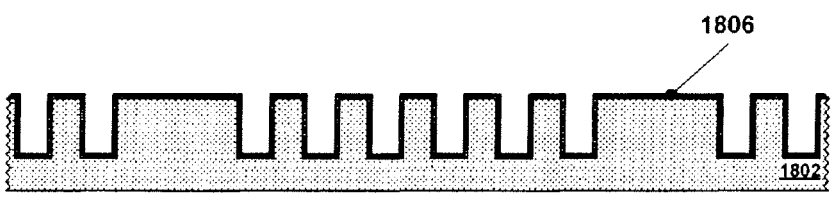
Figure 18E:
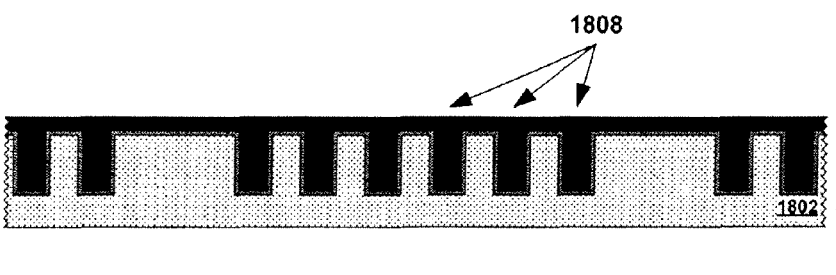

FIG. 17 is a flow chart algorithm for producing interposers in accordance with an exemplary embodiment of the present disclosure. FIGS. 18A-18J show exemplary results of corresponding processing steps. At step 1702, deep holes are formed in the interposer substrate. These holes are located where the desired vias are located. Several methods can be used to perform this step; deep reactive ion etching (DRIE) for example can produce deep vias with steep walls. However, other methods such as wet etching or laser drilling can be used instead. FIGS. 18A-18C show exemplary results from using an etching method for step 1702. Photoresist layer 1804 is applied to interposer substrate 1802 as shown in FIG. 18A. The photoresist layer 1804 is exposed to a mask and developed leaving openings where vias are desired as shown in FIG. 18B. Deep holes are etched in the openings in photoresist layer 1804 as shown in FIG. 18C. At step 1704, the surface of interposer 1802 and the walls of the vias are coated with a barrier material 1806, which is typically a dielectric such as silicon dioxide as show in FIG. 18D. Typically, the barrier material is applied by chemical vapor deposition (CVD). At step 1706, metal is deposited to fill the vias and on the surface of the interposer. The deposition process can use CVD, sputter, plating, a combination thereof, or other suitable processes. The deposition process can also include a less common alternative, such as filling the vias with a metal filled paste. For example, CVD or sputter can be used to create a seed layer of metal on top of the barrier layer. Then metal can be plated onto the seed layer to complete the deposition step.

Figure 18F:

At step 1708, opposite surface 1810 is ground down to expose the via metal as shown in FIG. 18F. The surface can be ground down by processes such as chemical mechanical polishing (CMP). At step 1710, the metal on the surface of the interposer is patterned into the desired pattern of interface pads and optionally a redistribution layer. There are several approaches to patterning the metal on the interface surface which are discussed below. At step 1712, the interface pads are plated with metal 1816. The plating can be solder, a nickel/gold, a nickel/palladium or some combination thereof. Alternatively, the plating step 1712 can also be performed after the interposer is attached to the active die as described in FIG. 21. Optionally, at step 1714, the interposers are singulated. In the examples given in FIGS. 9A, 9B and FIGS. 11A, 11B, the interposers are not singulated prior to assembly stop step 1720 would be omitted.

Figure 18G:
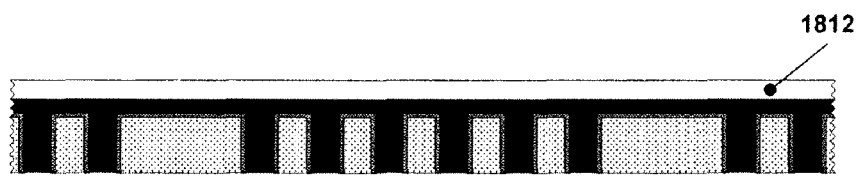
Figure 18H:
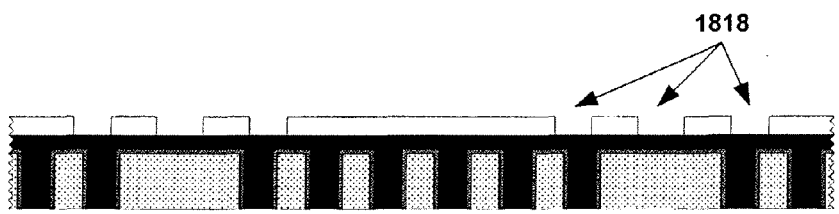
Figure 18I:
Figure 18J:
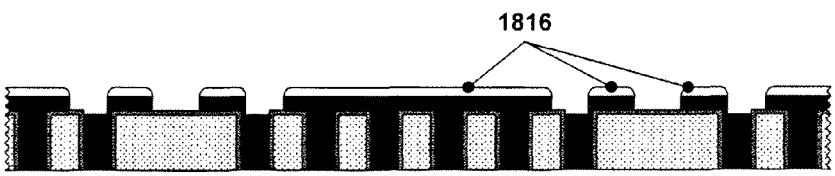

In one embodiment of step 1710, the patterning of the interface surface is illustrated in FIGS. 18G, 18H and 18I. In FIG. 18G, photoresist layer 1812 is applied to metal 1808. In FIG. 18H, photoresist layer 1812 is exposed to a mask and developed revealing openings 1814 in accordance with the desired pattern. In FIG. 18I, the metal is etched away by a wet etch process. The photoresist is then removed (not shown).

In another embodiment, the layer of metal deposited in step 1706 only provides a thin coating on the interface surface. The metal is etched away, for example by steps similar to shown in FIGS. 18G, 18H and 18I, leaving the desired pattern in the metal. Due to the thinness of the metal layer, the initial metal layer serves as a seed layer for additional metal deposition. After the seed layer is patterned, additional metal can be deposited by plating until the desired thickness is achieved.

In still another embodiment, the layer of deposited metal on the interface surface is ground down such as by CMP to the substrate leaving only the substrate and the via metal. Because the deposition in step 1706 often leaves depressions or dimples where the vias were filled, the resultant surface is not sufficiently flat to support fine metal lines for redistribution. After the grinding down step, a seed layer is deposited by sputtering or CVD, the result is a relatively flat metal layer on top of the interface surface of the interposer. The metal is etched away, for example by steps similar to shown in FIGS. 18G, 18H and 18I, leaving the desired pattern in the metal. Due to the thinness of the metal layer, after the seed layer is patterned, additional metal can be deposited by plating until the desired thickness is achieved.

It should be noted that for clarity, the barrier material is only depicted in FIGS. 18D-18J. However, it should be understood that the barrier material and other suitable material is present at the interface between the substrate and a filled via, interface pad or metal trace.

Figure 19:
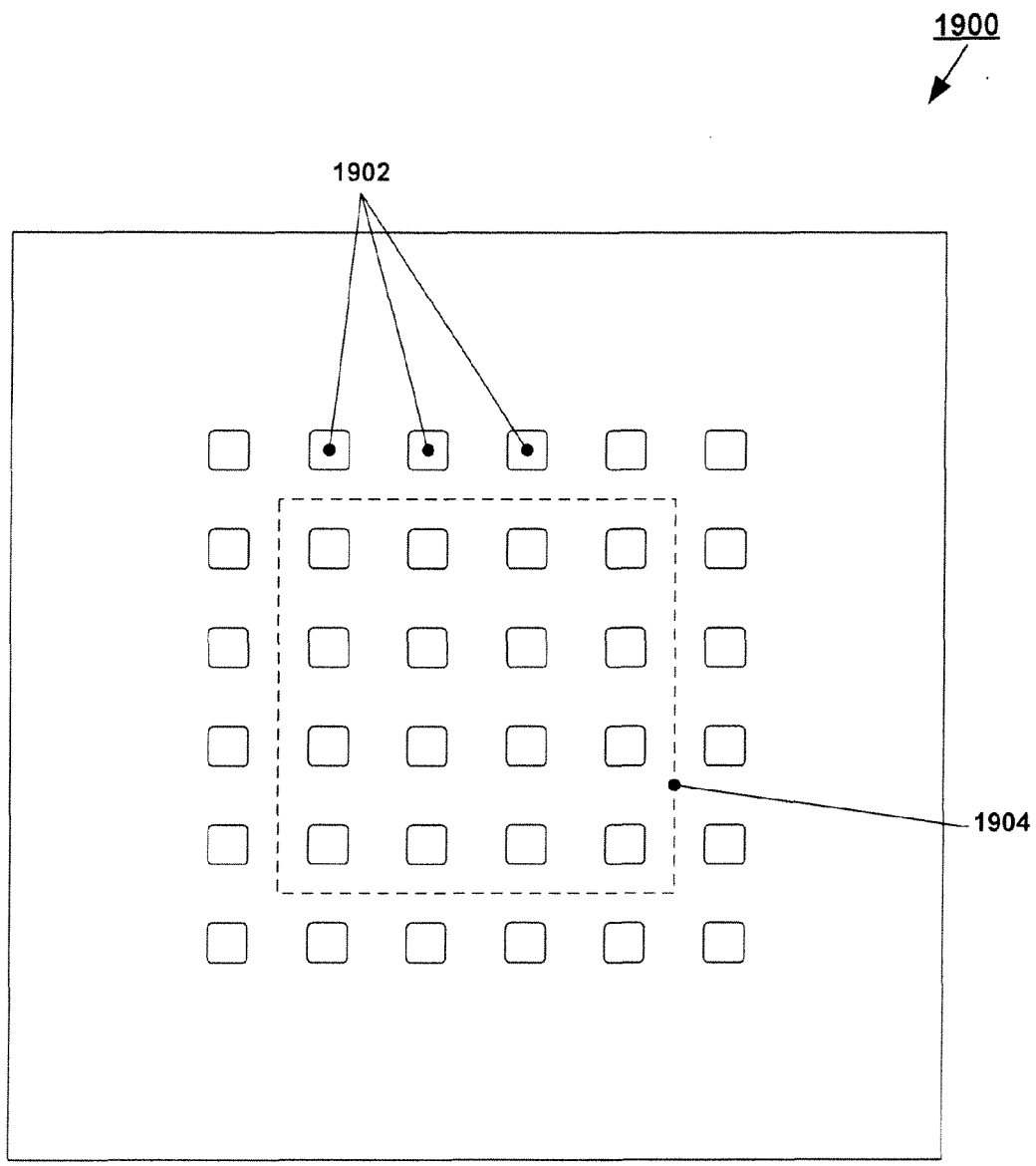
FIG. 19 and FIG. 20 show via, redistribution layer and interface pad patterns in accordance with an exemplary embodiment of the present disclosure.
Figure 20:
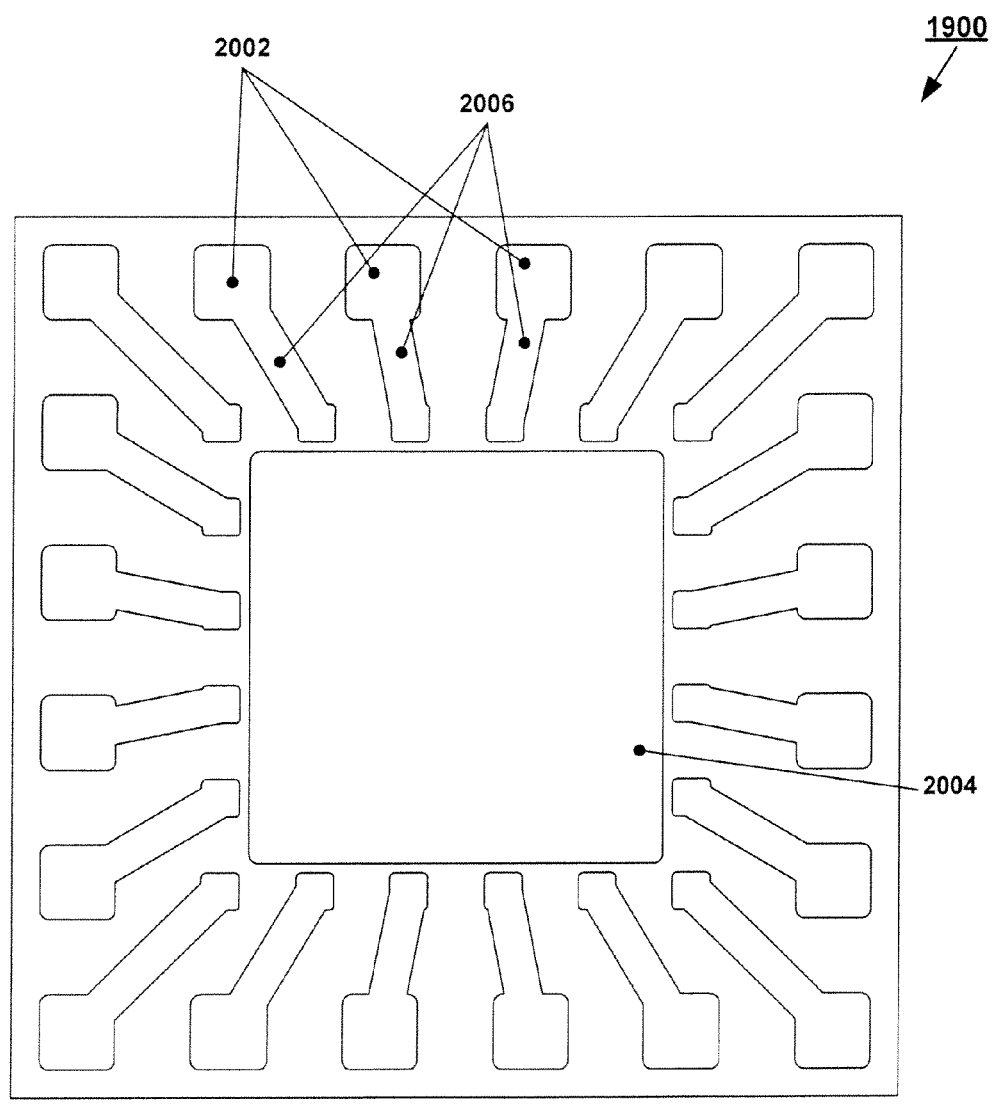

FIG. 19 and FIG. 20 show via, redistribution layer and interface pad patterns in accordance with an exemplary embodiment of the present disclosure. FIG. 19 is a top view of the contact surface of interposer 1900. The contact surface is the surface to which the active die is to be applied. Exterior catch pads represented by catch pads 1902 correspond to the bond pad locations of the active die and in this example are the exposed surface metal of underlying vias. These vias are used to electrically couple the bond pad to corresponding interface pads on the interface surface of interposer 1900. Interior catch pads 1904 are used for thermal purposes and in this example are the exposed surface metal of underlying vias. These vias make thermal contact with the active die and conduct heat to at least one thermal pad on the interface surface of interposer 1900. Optionally, these vias can also be electrically coupled to the ground on the active die.

FIG. 20 is a top view of the interface surface of interposer 1900 in accordance with an exemplary embodiment of the present disclosure. The interface surface is the surface which is used to interface the package to a system during assembly such as by attaching it to a PCB. Metal traces represented by traces 2006 lead from the electrical via locations (e.g., via 1902) to electrical interface pads such as interface pads 2002.

In addition, thermal interface pad 2004 is coupled to one or more thermal vias and is often attached to the ground plane during assembly allowing for heat from the active die to be conducted into the ground plane of a system.

It should be noted that though a simple redistribution layer is shown in the preceding examples, multiple layers can be fashioned onto the interposer substrate allowing for even more flexibility in signal routing and even a larger thermal pad which would allow for even greater thermal dissipation.

Figure 21:
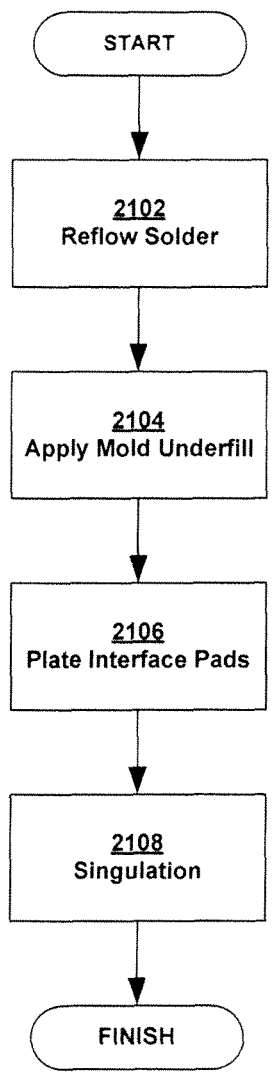
FIG. 21 is a flow chart algorithm of a process for completing the WLP package in accordance with an exemplary embodiment of the present disclosure.
Figure 22A:
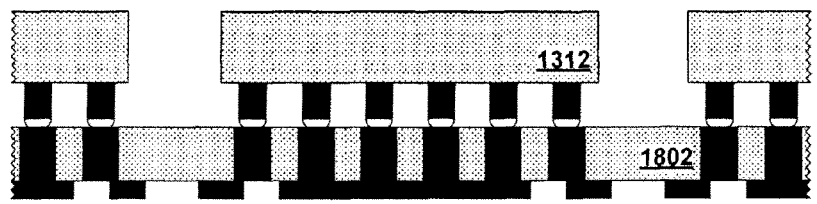
FIGS. 22A-D show structures that can be created using the exemplary processes disclosed in FIGS. 12 and 15-17.

FIG. 21 is a flow chart algorithm of a process for completing the WLP package in accordance with an exemplary embodiment of the present disclosure. Bump devices can be created by the process described in FIG. 12, 15 or 16. Interposers can be created by the process described in FIG. 17. FIGS. 22A-D show structures that can be created using the exemplary processes disclosed in FIGS. 12 and 15-17. At step 2102, the bumped devices are attached to the interposers. For example, the bumped devices are placed onto of the interposers and placed into a reflow oven. The reflow oven heats the structure allowing the solder bumps on the metal pillars of each bumped device to melt and bond with its corresponding vias on interposer. In FIG. 22A, the active dies are shown as singulated while the interposers share a common wafer substrate.

Figure 22B:
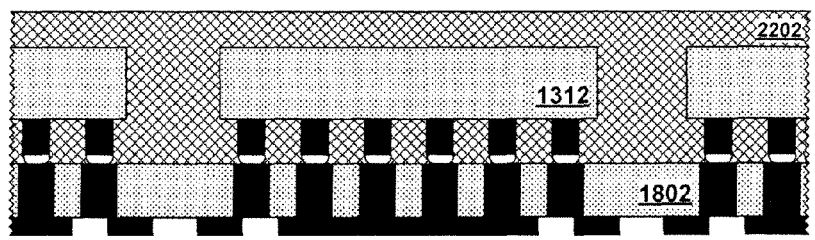
Figure 22C:
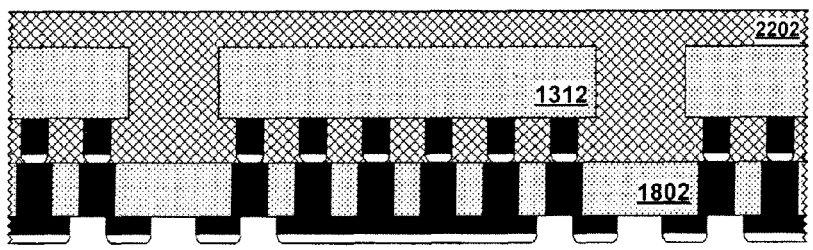

At step 2104, a mold underfill is applied to the structure. The mold compound 2202 is allowed to flow in the gaps between the metal pillars as well as any gaps between the active die. In the example of FIG. 22B, the mold compound also encapsulates the backside of the active dies. The molding process can employ one of several encapsulation techniques including injection molding or compression molding.

At step 2106, the interface pads are plated. The plating metal can be a solder material such as tin or a protective metal such as a nickel/palladium or nickel/palladium/flash gold alloy as previously discussed. This step can be performed if step 1712 is omitted or can be performed in addition to step 1712. Whether the plating is performed before or after the interposer is attached to the die depends on the equipment available at each step and the application of the semiconductor package.

Figure 22D:
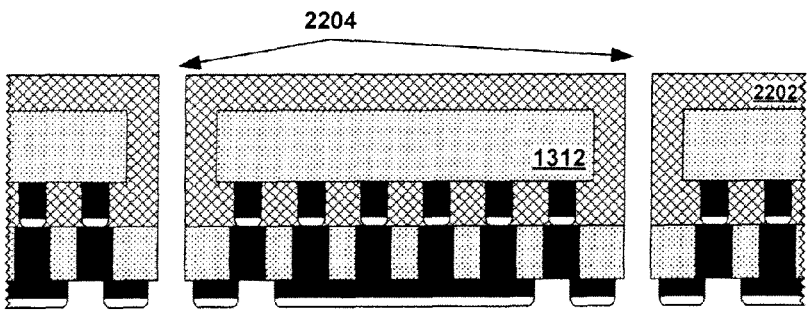

At step 2108, each package is singulated into individual packages as shown in FIG. 22D, where gaps 2204 indicate the singulation incision. Singulation can be performed by saw singulation where the individual packages are sawn apart or by less commonly by punch singulation.

Figure 23:
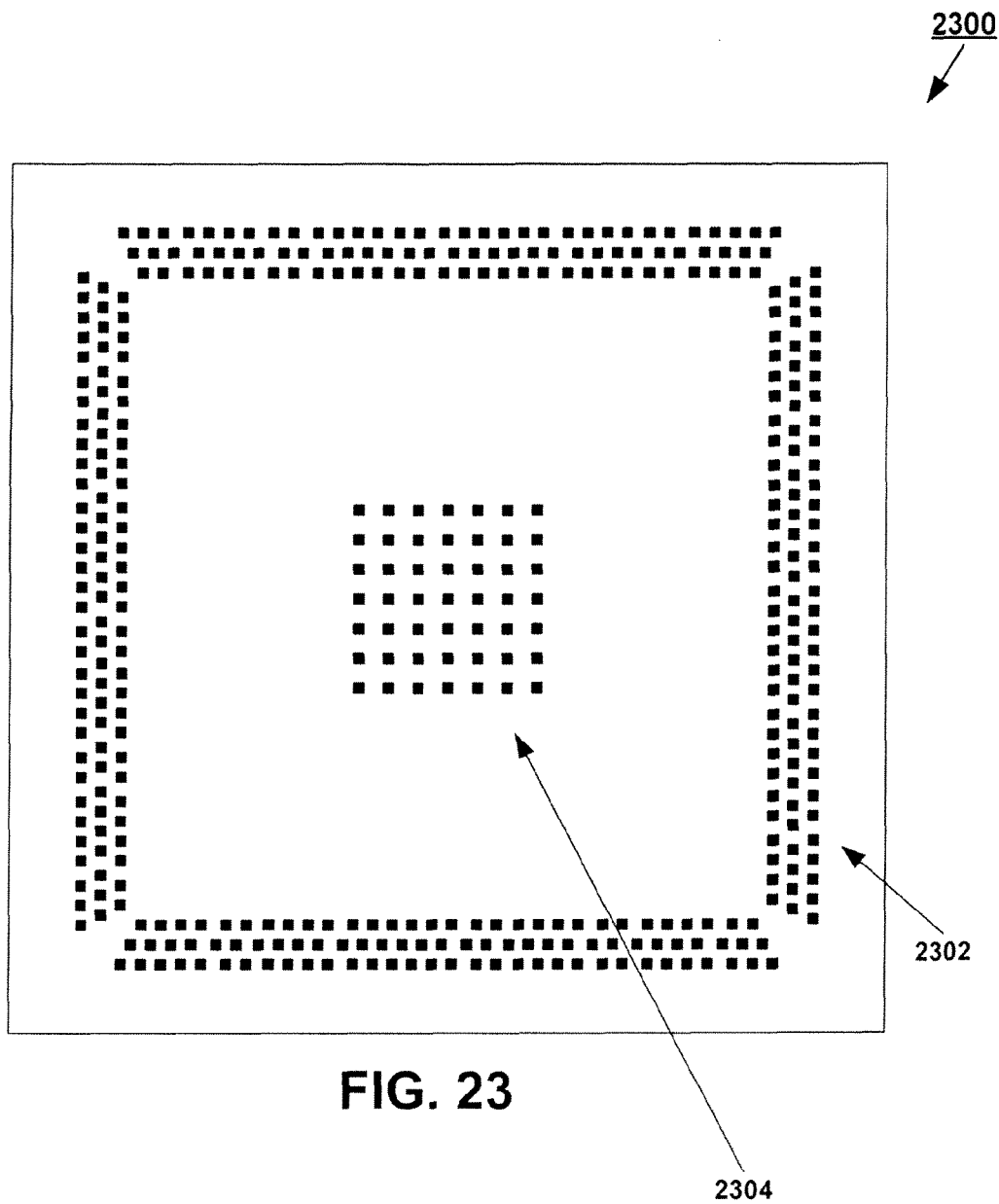
FIG. 23 illustrates an example of where variable pitch can be used for the different types of vias in an interposer.

FIG. 23 illustrates an example of where variable pitch can be used for the different types of vias in an interposer. The figure shows a top view of the contact side of interposer 2300. Interposer 2300 comprises a plurality of electrical vias (e.g., vias 2302) and a plurality of thermal vias (e.g., vias 2304). In this example, the pitch of the thermal vias is twice that of electrical vias. For example, thermal via pitch could be 250 μm and the electrical via pitch could be 125 μm, or vice versa. Furthermore, this example illustrates the densities of vias on an interposer. The preceding examples have their numbers reduced for clarity, but in practical examples, the vias could number in the hundreds or more as illustrated in FIG. 23.

Figure 24:
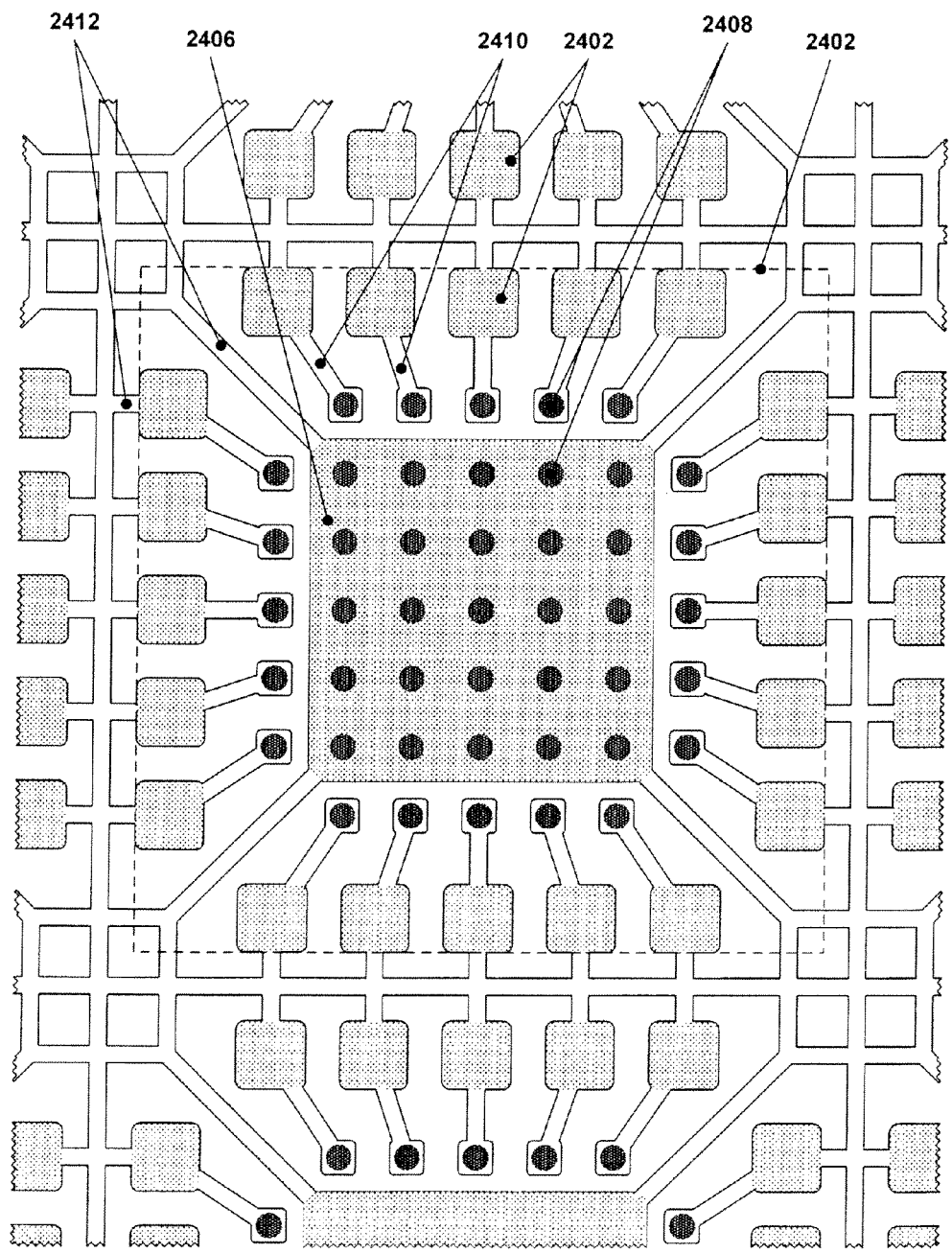
FIG. 24 shows a metal leadframe used as an interposer prior to singulation.

An alternative to using an interposer built on top of a substrate wafer is to use a metal leadframe as the interposer. Metal lead frames are common in some types of packaging including quad flat no-leads (QFN) packages. FIG. 24 shows a metal leadframe used as an interposer prior to singulation. Dotted line 2402 shows an interposer constructed for a single active die. The unshaded structures are half etched (e.g., metal trace 2410 and tie bar 2412) and the shaded structures are not etched including the electrical pads (e.g., 2404) and thermal pads (e.g., 2406). Only the shaded structures are accessible on the interface side of the metal leadframe. On the contact side, the bumped device can be attached to the metal leadframe. The metal pads on the contact side are function as catch pads. The dark circles (e.g., 2408) show the placement of the metal pillars on the bumped device relative to the catch pads on the metal leadframe. Tie bars (e.g., 2412) are used to hold metal leadframe together until the package is singulated where the tie bars are removed. For example, often the connecting tie bars are smaller than the blade width of the singulating saw. Thus, when the saw singulates the package it consumes much of the tie bar structure, leaving only what is shown within dotted line 2402.

Figure 25:
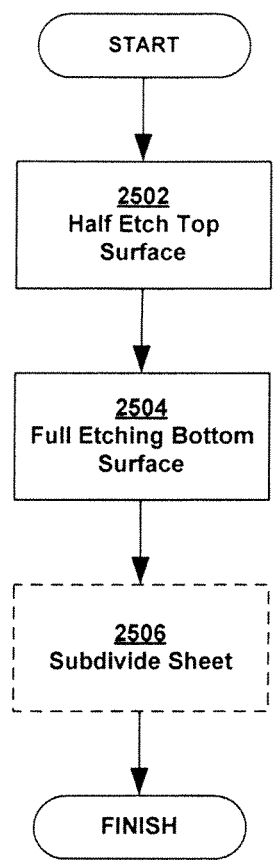
FIG. 25 shows a typical process for creating a metal leadframe.

FIG. 25 shows a typical process for creating a metal leadframe. At step 2502, the pattern on the interface side is half etched into a metal sheet. An example of the specific steps to etching is to apply a photoresist material, expose it to the desired pattern developing the photoresist material, etching the metal to a predetermined fraction of the metal thickness and the removal of the remaining photoresist material. Several etching processes can be used, such as wet etching. At step 2504, the pattern on the contact side of the metal sheet is fully etched. Once again a photoresist-etch process can be used. Optionally, at step 2506, the sheet can be subdivided into strips.

The assembly of the bumped device to the metal leadframe interposer is similar to that described in FIG. 21, except at step 2104 the gaps within the metal leadframe can be filled with mold compound in addition to other suitable spaces, such as the space between the metal pillars and between the active die and interposer.

Figure 26:
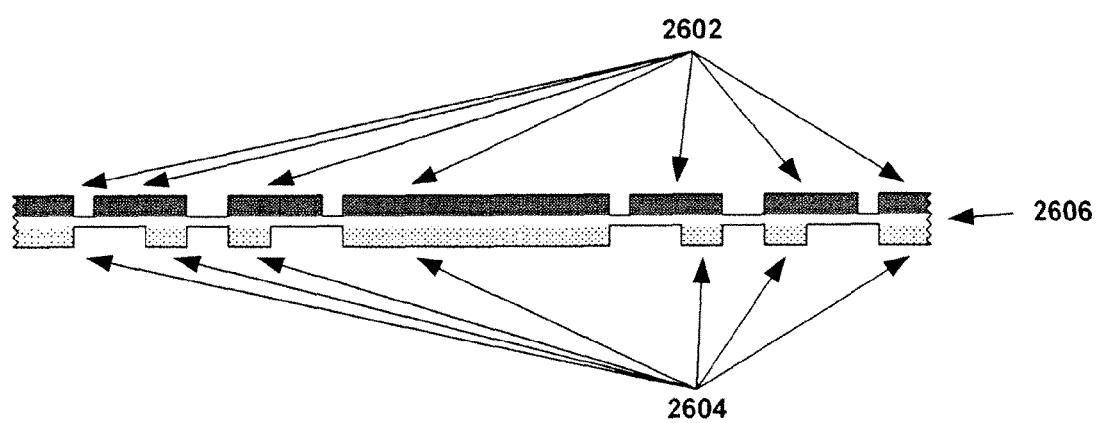
FIG. 26 shows a side view of an exemplary metal leadframe where both surfaces are partially etched.

One limitation to the metal leadframe is the need for tie bars. Tie bars occupy some space and limit the topology of the leadframe. For example, there can be no free standing structures on the metal leadframe because they would fall out. Recently, metal lead frames are delivered with both surfaces partially etched leaving a thin sheet intact between the two surfaces. FIG. 26 shows a side view of an exemplary metal leadframe where both surfaces are partially etched. Structures indicated by arrow 2602 show the structures such as catch pads and metal traces on the contact side of the leadframe. Structures indicated by arrow 2604 show the structures such as electrical and thermal interface pads on the interface side of the leadframe. Arrow 2606 shows the continuous sheet in between.

Figure 27A:
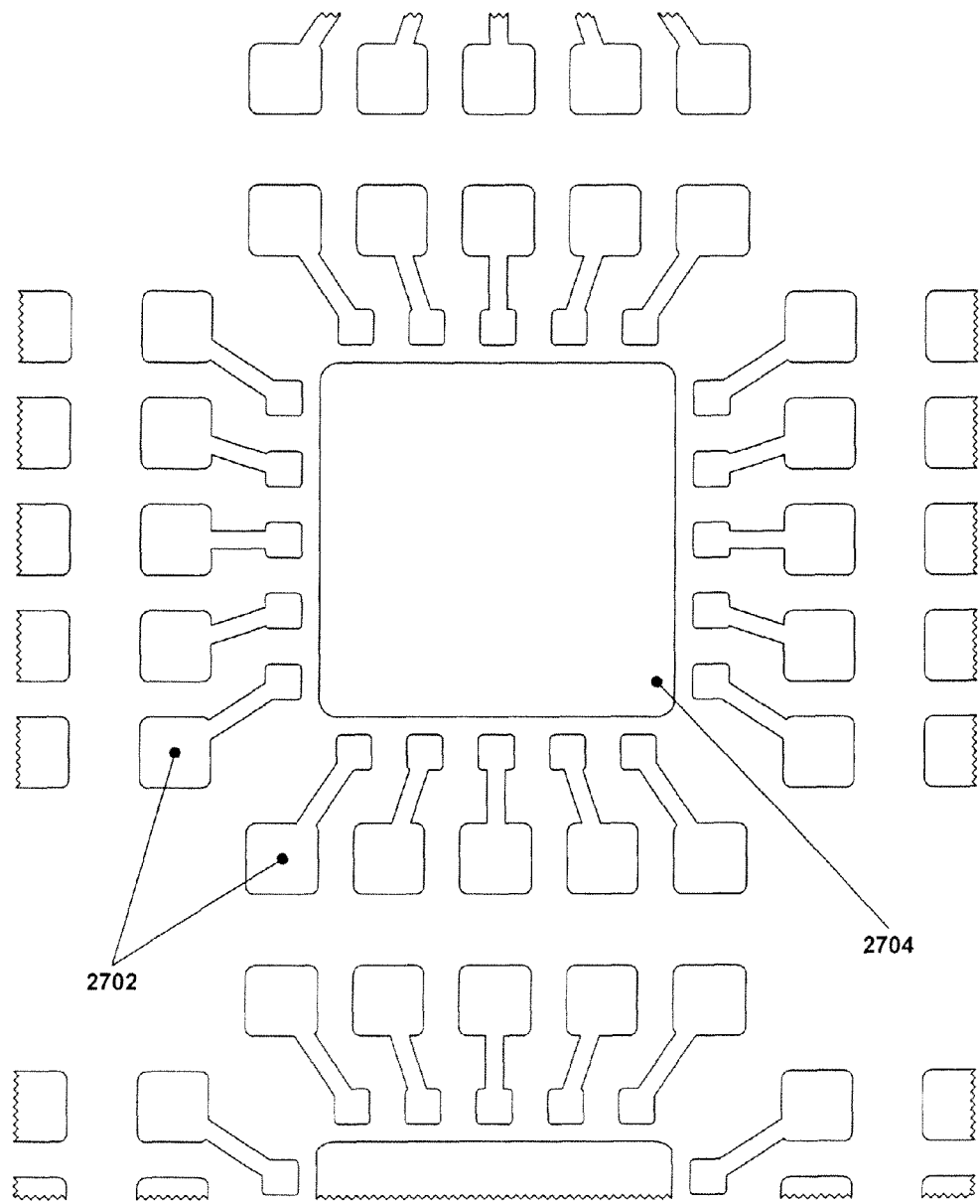
FIG. 27A shows the contact surface of a metal leadframe.

FIG. 27A shows the contact surface of a metal leadframe. As a comparison, the connection structures are shown here as in FIG. 24. It comprises a plurality of metal traces connecting the electrical catch pads to their corresponding interface pads (e.g., structure 2702). It comprises thermal pad 2704.

Figure 27B:
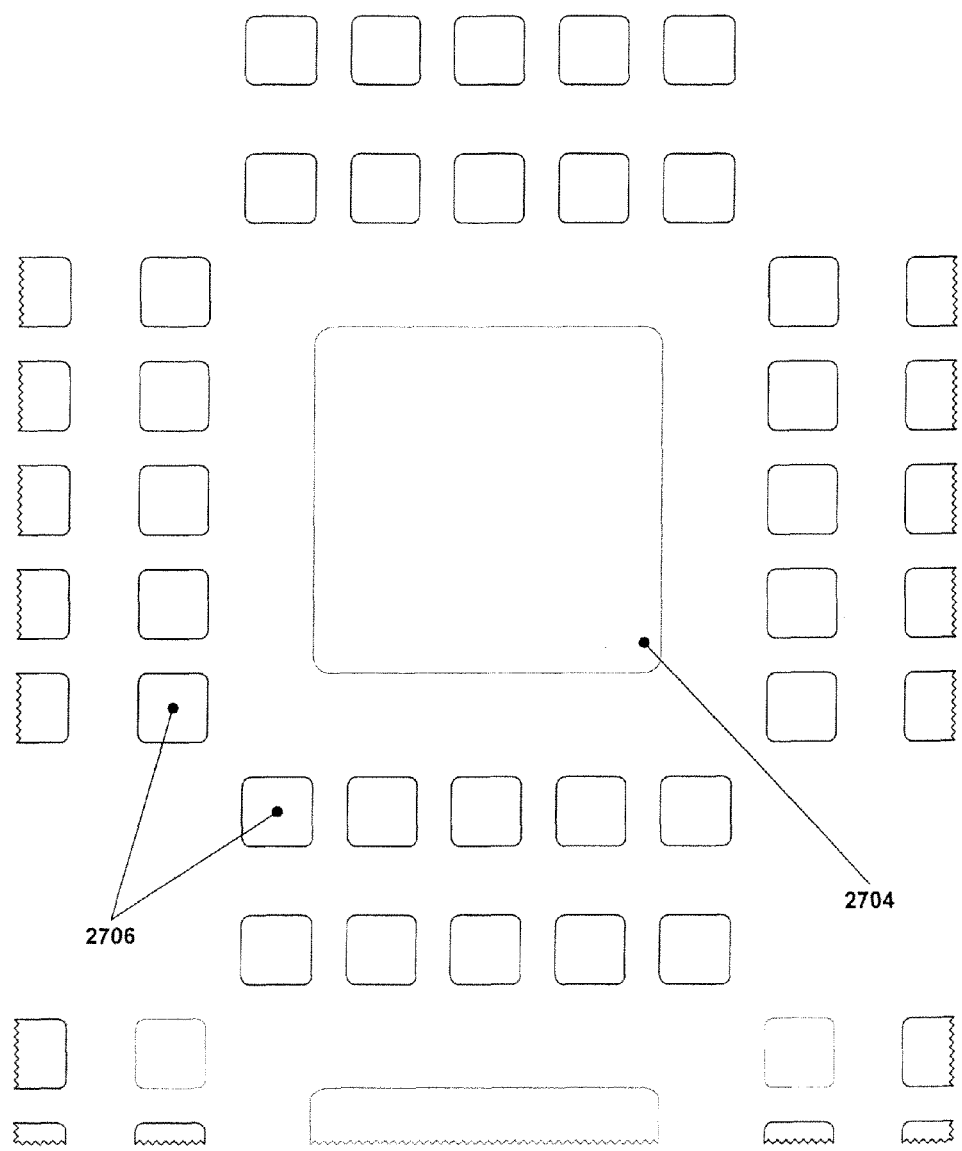
FIG. 27B shows the interface surface of the same metal leadframe.

FIG. 27B shows the interface surface of the same metal leadframe. On this surface only the electrical (e.g., 2706) and thermal interface pads (e.g., 2704) are visible. After a leadframe of this type is assembled into a package, the interface surface is further etched to remove the intervening metal sheet.

The method of fabricating this type of metal leadframe is similar to that shown in FIG. 25, except at step 2504, the contact surface pattern does not need to be etched fully, but instead can be etched partially. The depth of the etch in step 2502 can also be modified to leave a metal sheet in between. For example, step 2502 can etch a pattern to 45% of the metal thickness and step 2504 can etch another pattern to 45% of the metal thickness leaving 10% of the thickness of the original metal throughout the leadframe.

Figure 28:
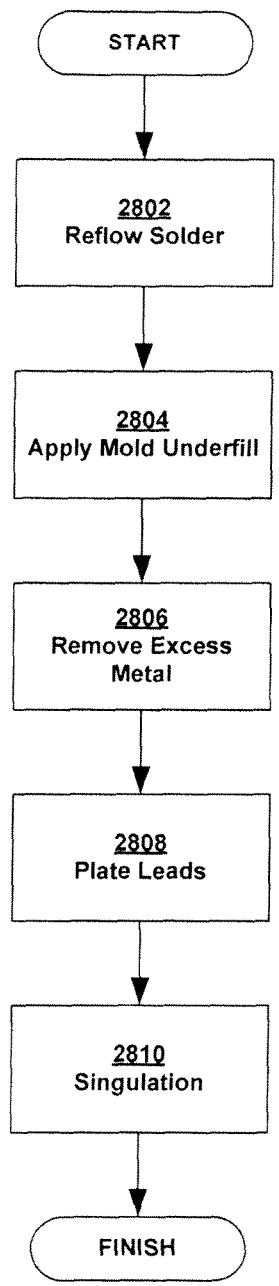

The process of assembling the WLP package comprises an additional step over that described in FIG. 21 and is described in FIG. 28. FIGS. 29A-E show the corresponding structures that are created by the various process steps. At step 2802, the bumped devices are attached to metal leadframe 2902. For example, the bumped devices are placed onto of metal leadframe 2902 and placed into a reflow oven. The reflow oven heats the structure allowing the solder bumps on the metal pillars of each bumped device to melt and bond with its corresponding vias on interposer. In FIG. 28A, the active dies are shown as singulated while the interposers metal leadframe are connected between packages.

Figure 29A:
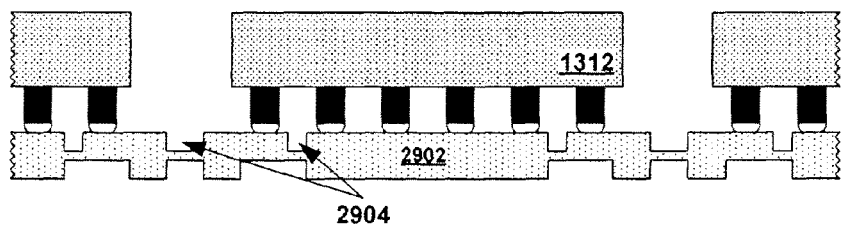
FIGS. 29A-E show the corresponding structures that are created by the various process steps.
Figure 29B:
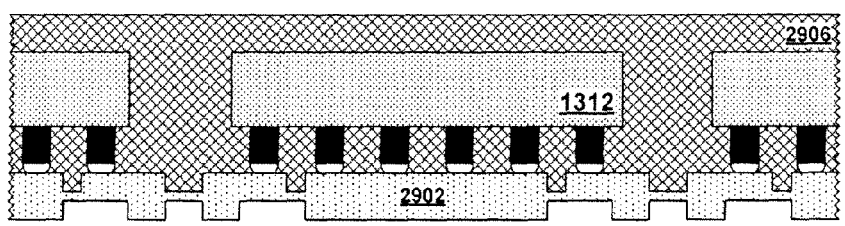

At step 2804, a mold underfill is applied to the structure. The mold compound 2906 is allowed to flow in the gaps between the metal pillars as well as any gaps between the active die. In addition, mold compound 2906 is allowed to flow in the gaps between the metal in metal leadframe 2902 (e.g., gaps indicated by arrows 2904). In the example of FIG. 29B, the mold compound also encapsulates the backside of the active dies. The molding process can employ one of several encapsulation techniques including injection molding or compression molding.

Figure 29C:
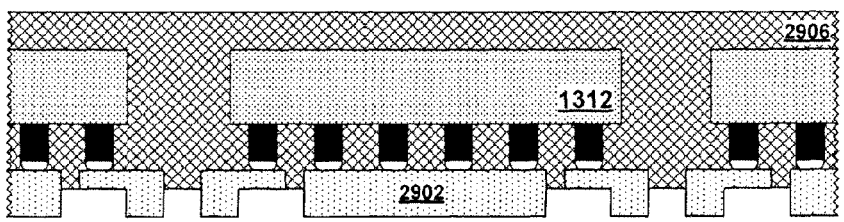

At step 2806, the excess metal on metal leadframe 2902 is removed. This results in better definition of features such as the electrical and thermal interface pads and removes intervening metal between discrete structures. This removal can be a chemical etching process such as a wet etching or a physical process and is shown in FIG. 29C

Figure 29D:
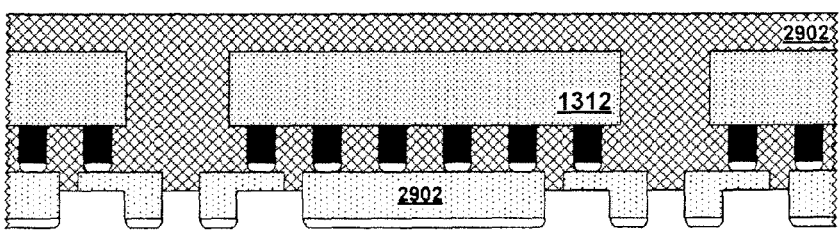

At step 2808, the interface pads are plated. The plating metal can be a solder material such as tin or a protective metal such as a nickel/palladium or nickel/palladium/flash gold alloy as previously discussed. This is shown in FIG. 29D.

Figure 29E:
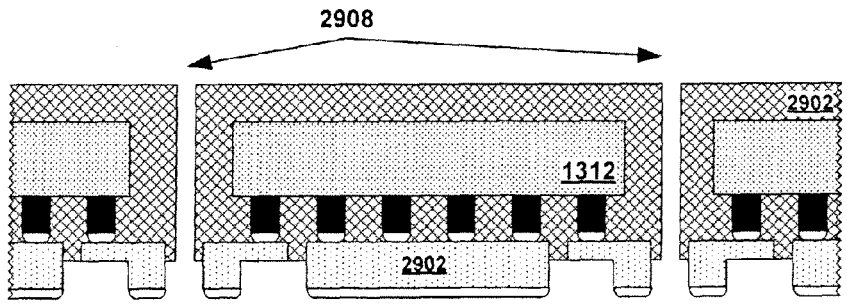

At step 2810, each package is singulated into individual packages as shown in FIG. 29E, where gaps 2908 indicate the singulation incision. Singulation can be performed by saw singulation where the individual packages are sawn apart or by less commonly by punch singulation.

It should be emphasized that the above-described embodiments are merely examples of possible implementations. Suitable variations and modifications can be made to the above-described embodiments without departing from the principles of the present disclosure. For example, examples given in the context of SPDIF formatting can be applied to any suitable MC coding format using preambles for synchronization. All such modifications and variations are intended to be included herein within the scope of this disclosure and protected by the following claims.

What is claimed is:

1. A method of packaging a semiconductor into a package comprising:
   attaching a semiconductor die to a wafer;
   applying a first passivation layer;
   forming openings in the first passivation layer including an opening for a thermal pad;
   depositing metal into the openings in the first passivation layer to partially form the thermal pad;
   applying a second passivation layer;
   forming openings in the second passivation layer including an opening for the thermal pad and one or more openings for electrodes;
   depositing metal into the opening in the second passivation layer for the thermal pad to complete the thermal pad;
   depositing metal into the one or more openings for electrodes in the second passivation layers to complete the electrodes; and
   singulating the package into individual packages.

2. The method of claim 1, wherein the first passivation layer and the second passivation comprise a dielectric.

3. The method of claim 1 further comprising forming one or more metal bumps on the thermal pad.

4. The method of claim 1 further comprising forming one or more metal bumps on the electrodes.

5. The method of claim 1 wherein depositing metal into the openings in the first passivation layer to partially form the thermal pad further comprises depositing metal traces for a distribution layer.

6. The method of claim 1 wherein depositing metal into the openings in the first passivation layer to partially form the thermal pad further comprises forming one or more metal pillars.

* * * * *